(12) United States Patent
Jeon et al.

(10) Patent No.: US 12,501,672 B2
(45) Date of Patent: Dec. 16, 2025

(54) SEMICONDUCTOR DEVICE

(71) Applicant: SAMSUNG ELECTRONICS CO., LTD., Suwon-si (KR)

(72) Inventors: Yong Uk Jeon, Suwon-si (KR); Kyung Ho Kim, Suwon-si (KR); Ki Hwan Kim, Suwon-si (KR); Kang Hun Moon, Suwon-si (KR); Cho Eun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 449 days.

(21) Appl. No.: 18/127,298

(22) Filed: Mar. 28, 2023

(65) Prior Publication Data
US 2024/0063262 A1 Feb. 22, 2024

(30) Foreign Application Priority Data
Aug. 22, 2022 (KR) .......................... 10-2022-0104783

(51) Int. Cl.
*H01L 29/06* (2006.01)
*H01L 27/092* (2006.01)
(Continued)

(52) U.S. Cl.
CPC ........... *H10D 62/121* (2025.01); *H10D 30/43* (2025.01); *H10D 30/6735* (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021;
(Continued)

(56) References Cited

U.S. PATENT DOCUMENTS 8,796,788 B2 * 8/2014 Kwok ................ H10D 30/0212
257/341
11,158,727 B2 * 10/2021 Wang .................... H10D 64/01
(Continued)

FOREIGN PATENT DOCUMENTS

KR  10-2005-0116707 A  12/2005
KR  10-2018-0123422 A  11/2018
(Continued)

*Primary Examiner* — David C Spalla
(74) *Attorney, Agent, or Firm* — Sughrue Mion, PLLC

(57) ABSTRACT

A semiconductor device is provided. The semiconductor device includes: an active pattern extending in on a substrate; nanosheets stacked on the active pattern; a gate electrode on the active pattern and surrounding the nanosheets; a source/drain trench on the active pattern adjacent the gate electrode; and a source/drain region in the source/drain trench, The source/drain region includes: a first layer provided along a sidewall and a bottom surface of the source/drain trench, the first layer having a first n-type impurity doped therein; a second layer on the first layer in the source/drain trench, the second layer having germanium (Ge) doped therein; and a third layer filling a remaining portion of the source/drain trench on the second layer, the third layer having a second n-type impurity doped therein.

20 Claims, 24 Drawing Sheets

(51) Int. Cl.
*H01L 29/423* (2006.01)
*H01L 29/66* (2006.01)
*H01L 29/775* (2006.01)
*H01L 29/786* (2006.01)
*H10D 30/43* (2025.01)
*H10D 30/67* (2025.01)
*H10D 62/10* (2025.01)
*H10D 64/01* (2025.01)
*H10D 84/85* (2025.01)

(52) U.S. Cl.
CPC ....... *H10D 30/6757* (2025.01); *H10D 64/017* (2025.01); *H10D 64/018* (2025.01); *H10D 84/85* (2025.01)

(58) Field of Classification Search
CPC .. H10D 62/118; H10D 62/119; H10D 62/121; H10D 62/149; H10D 62/151; H10D 64/015; H10D 64/017; H10D 64/018; H10D 64/021; H10D 84/013; H10D 84/0158; H10D 84/017; H10D 84/0193; H10D 84/834; H10D 84/85; H10D 84/853

See application file for complete search history.

(56) References Cited

U.S. PATENT DOCUMENTS

| | | | |
|---|---|---|---|
| 11,302,796 | B2 | 4/2022 | Wang et al. |
| 2022/0059703 | A1 | 2/2022 | More |
| 2022/0367728 | A1* | 11/2022 | Lin .................... H10D 30/6715 |
| 2023/0145872 | A1* | 5/2023 | Wang .................. H10D 64/017 257/347 |
| 2024/0055485 | A1* | 2/2024 | Chang ............... H01L 21/28518 |

FOREIGN PATENT DOCUMENTS

| | | |
|---|---|---|
| KR | 10-2019-0133554 A | 12/2019 |
| KR | 10-2021-0133119 A | 11/2021 |
| KR | 10-2022-0027742 A | 3/2022 |

* cited by examiner

SEMICONDUCTOR DEVICE

CROSS-REFERENCE TO RELATED APPLICATION

This application claims priority from Korean Patent Application No. 10-2022-0104783, filed on Aug. 22, 2022, in the Korean Intellectual Property Office, the disclosure of which is incorporated herein by reference in its entirety.

BACKGROUND

1. Field

The present disclosure relates to a semiconductor device. Specifically, the present disclosure relates to a semiconductor device including a Multi-Bridge Channel Field Effect Transistor (MBCFET™).

2. Description of Related Art

Integration density of an integrated circuit device may be increased by employing a multi-channel transistor in which a silicon body in a shape of a plurality of fins or nanowires (or nanosheets) is formed on a substrate, and a gate is formed on a surface of the silicon body.

Because such a multi-channel transistor is formed of a three-dimensional channel structure, the multi-channel transistor may be scaled. Further, current control capability of the multi-channel transistor may be improved without increasing a gate length of the multi-channel transistor. In addition, the multi-channel transistor may effectively suppress short channel effect (SCE) in which potential of a channel region is affected by drain voltage.

SUMMARY

One or more embodiments provide a semiconductor in which a source/drain region of a transistor formed in an n-type metal-oxide-semiconductor field-effect transistor (NMOS) region includes first to third layers sequentially stacked, wherein the second layer disposed between the first and third layers includes doped germanium (Ge), so that the third layer as a filling layer has improved gap fill. Thus, in the transistor formed in the NMOS region in the semiconductor device, an air gap may be prevented from being formed in the source/drain region or a size of the air gap may be reduced, thereby improving reliability of the semiconductor device.

According to some embodiments, a semiconductor device includes: a substrate with an NMOS region; an active pattern extending in a first horizontal direction on the substrate; a plurality of nanosheets stacked on the active pattern and spaced apart from each other in a vertical direction; a gate electrode on the active pattern and surrounding the plurality of nanosheets, wherein the gate electrode extends in a second horizontal direction different from the first horizontal direction; a source/drain trench on the active pattern adjacent the gate electrode; and a source/drain region in the source/drain trench. The source/drain region includes: a first layer provided along a sidewall and a bottom surface of the source/drain trench, the first layer having a first n-type impurity doped therein; a second layer on the first layer in the source/drain trench, the second layer having germanium (Ge) doped therein; and a third layer filling a remaining portion of the source/drain trench on the second layer, the third layer having a second n-type impurity doped therein.

According to some embodiments, a semiconductor device includes: a substrate with an NMOS region; an active pattern extending in a first horizontal direction on the substrate; a plurality of nanosheets stacked on the active pattern and spaced apart from each other in a vertical direction; a gate electrode on the active pattern and surrounding the plurality of nanosheets, wherein the gate electrode extends in a second horizontal direction different from the first horizontal direction; a source/drain trench on the active pattern adjacent the gate electrode; a source/drain region in the source/drain trench; and a gate insulating layer between the gate electrode and the source/drain region between adjacent ones of the plurality of nanosheets, the gate insulating layer being in contact with the source/drain region. The source/drain region includes: a first layer continuously extending along a sidewall and a bottom surface of the source/drain trench, the first layer having a first n-type impurity doped therein; and a second layer on the first layer in the source/drain trench, the second layer having germanium (Ge) doped therein.

According to some embodiments, a semiconductor device includes: a substrate with an NMOS region; an active pattern extending in a first horizontal direction on the substrate; a plurality of nanosheets stacked on the active pattern and spaced apart from each other in a vertical direction; a gate electrode on the active pattern and surrounding the plurality of nanosheets, wherein the gate electrode extends in a second horizontal direction different from the first horizontal direction; a source/drain trench on the active pattern adjacent the gate electrode; a source/drain region in the source/drain trench; and a gate insulating layer between the gate electrode and the source/drain region between adjacent ones of the plurality of nanosheets, the gate insulating layer being in contact with the source/drain region. The source/drain region includes: a first layer continuously extending along a sidewall and a bottom surface of the source/drain trench, the first layer being in contact with a sidewall of each of the plurality of nanosheets, and the first layer having a first n-type impurity doped therein; a second layer on the first layer in the source/drain trench, the second layer being in contact with the first layer, and the second layer having germanium (Ge) doped therein; and a third layer filling a remaining portion of the source/drain trench on the second layer, the third layer having a second n-type impurity doped therein. Each of the first n-type impurity and the second n-type impurity is different from germanium (Ge), and each of the first layer, the second layer and the third layer overlaps an uppermost nanosheet of the plurality of nanosheets in the first horizontal direction.

The present disclosure is not limited to embodiments set forth herein.

BRIEF DESCRIPTION OF DRAWINGS

The above and other aspects and features will be more apparent from the following description of embodiments with reference to the attached drawings, in which.

DETAILED DESCRIPTION

Figure 1:
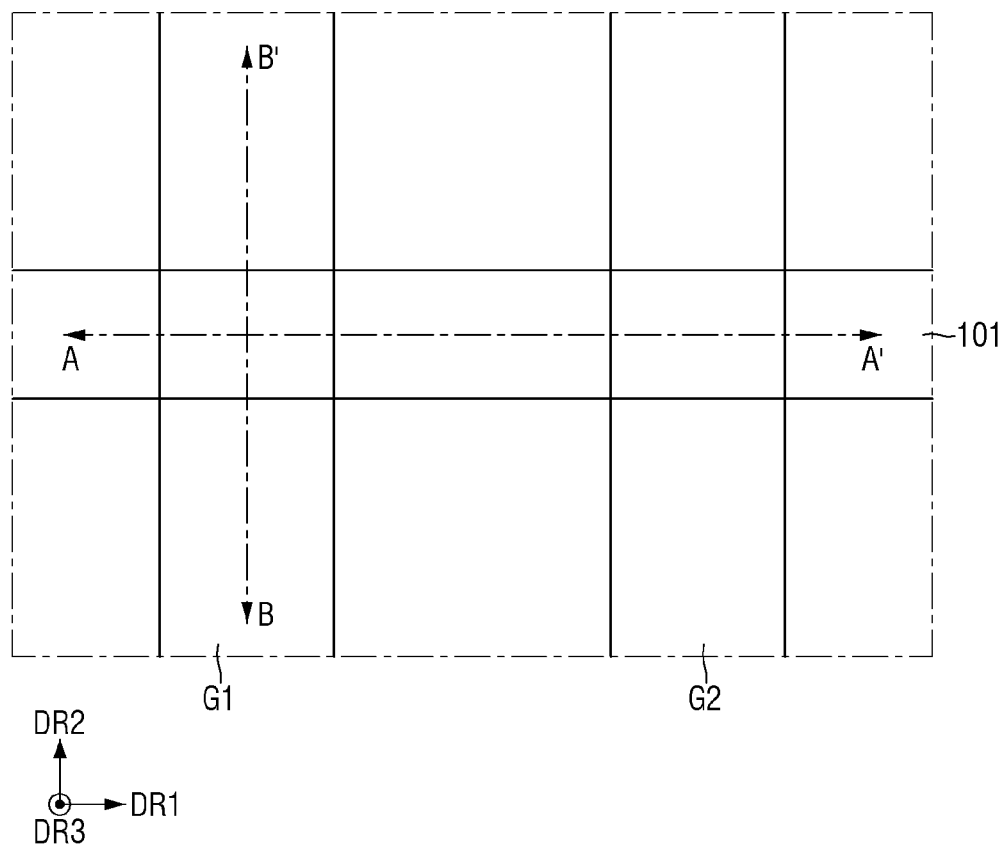
FIG. 1 is a schematic layout diagram illustrating a semiconductor device according to some embodiments.

Embodiments will now be described with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. In the drawings related to the semiconductor device according to some embodiments below, an example in which the semiconductor device includes a Multi-Bridge Channel Field Effect Transistor (MBCFET™) including a nanosheet is described. However, the present disclosure is not limited thereto. In some further embodiments, the semiconductor device may include a tunneling transistor (tunneling FET), a three-dimensional (3D) transistor, or a 2D material based FET based on a two-dimensional (2D) material, or a heterostructures thereof. Further, the semiconductor device according to some embodiments may include a bipolar junction transistor, a lateral double diffusion transistor (LDMOS), or the like.

Hereinafter, a semiconductor device according to some embodiments will be described with reference to FIG. 1 to FIG. 3.

FIG. 1 is a schematic layout diagram illustrating a semiconductor device according to some embodiments. FIG. 2 is a cross-sectional view taken along a line A-A' in FIG. 1. FIG. 3 is a cross-sectional view taken along a line B-B' in FIG. 1.

Figure 2:
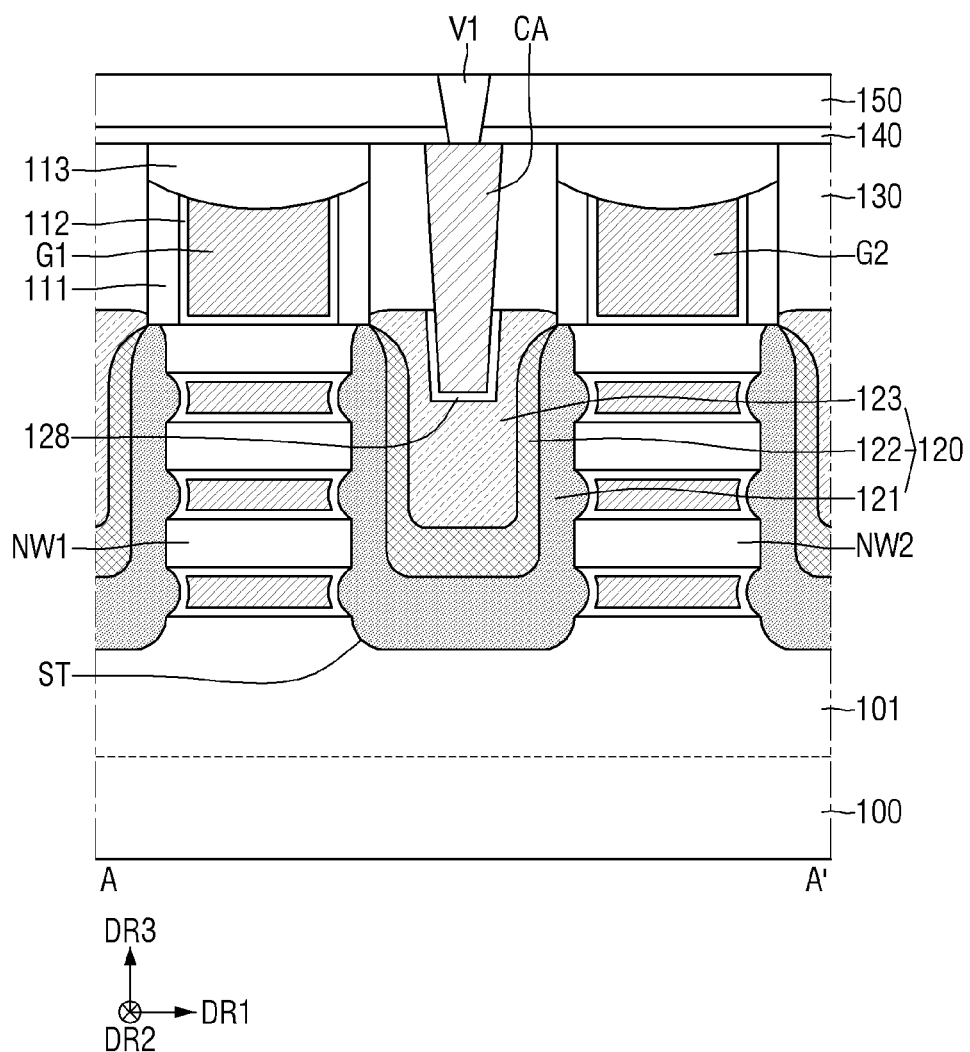
FIG. 2 is a cross-sectional view taken along a line A-A' in FIG. 1.
Figure 3:
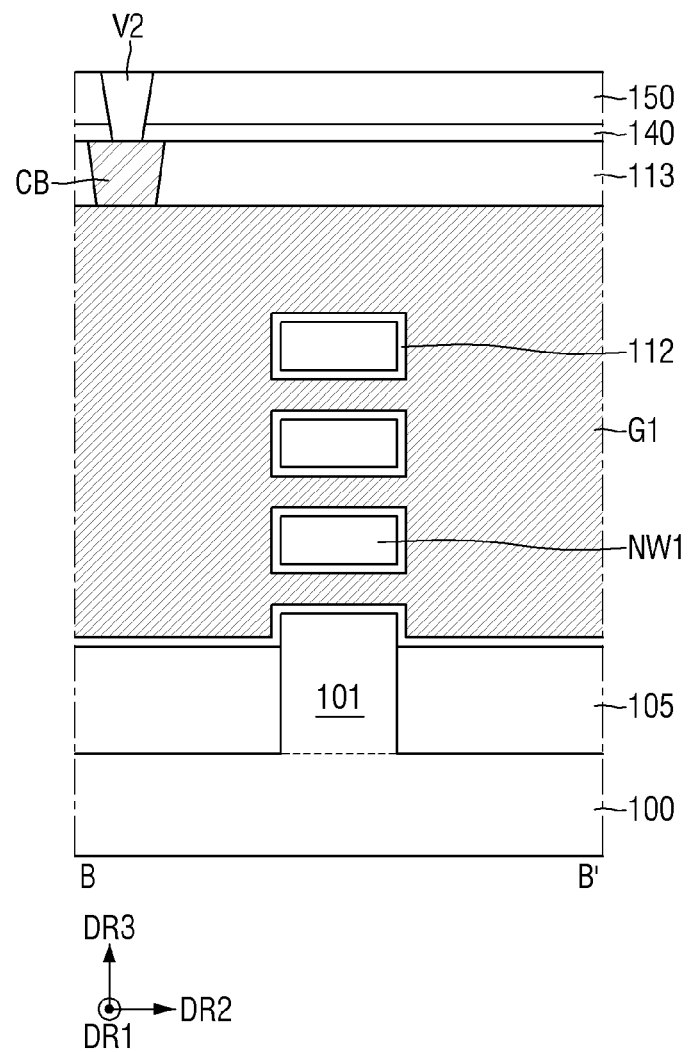
FIG. 3 is a cross-sectional view taken along a line B-B' in FIG. 1.

Referring to FIG. 1 to FIG. 3, the semiconductor device according to some embodiments includes a substrate 100, an active pattern 101, a field insulating layer 105, first and second pluralities of nanosheets NW1 and NW2, first and second gate electrodes G1 and G2, a gate spacer 111, a gate insulating layer 112, a capping pattern 113, a source/drain region 120, a silicide layer 128, a first interlayer insulating layer 130, a source/drain contact CA, a gate contact CB, an etch stop layer 140, a second interlayer insulating layer 150, a first via V1 and a second via V2. transistor The substrate 100 may be embodied as a silicon substrate or a silicon-on-insulator (SOI). Alternatively, the substrate 100 may include silicon germanium, silicon germanium on insulator (SGOI), indium antimonide, lead telluride, indium arsenide, indium phosphide, gallium arsenide or gallium antimonide. However, the present disclosure is not limited thereto. For example, the substrate 100 may be embodied as a substrate defining an n-type metal-oxide-semiconductor field-effect transistor (NMOS) region. That is, the NMOS transistor may be formed on the substrate 100.

Hereinafter, each of a first horizontal direction DR1 and a second horizontal direction DR2 may be a direction parallel to an upper surface of the substrate 100. The second horizontal direction DR2 may be a direction different from the first horizontal direction DR1. A vertical direction DR3 may be a direction that is perpendicular to a plane defined by the first horizontal direction DR1 and the second horizontal direction DR2.

The active pattern 101 may extend in the first horizontal direction DR1 while being disposed on the substrate 100. The active pattern 101 may extend from the substrate 100 in the vertical direction DR3. For example, the active pattern 101 may be a portion of the substrate 100 or may include an epitaxial layer grown from the substrate 100.

The field insulating layer 105 may be disposed on the substrate 100. The field insulating layer 105 may surround a sidewall of the active pattern 101. For example, an upper surface of the active pattern 101 may protrude in the vertical direction DR3 beyond an upper surface of the field insulating layer 105. However, the present disclosure is not limited thereto. In some further embodiments, the upper surface of the active pattern 101 and the upper surface of the field insulating layer 105 may be coplanar with each other. The field insulating layer 105 may include, for example, an oxide film, a nitride film, an oxynitride film, or a combination film thereof.

The first plurality of nanosheets NW1 may be disposed on the active pattern 101. The first plurality of nanosheets NW1 may be disposed in a region where the active pattern 101 and the first gate electrode G1 intersect each other. The first plurality of nanosheets NW1 may include a plurality of nanosheets stacked on top of each other and spaced apart from each other in the vertical direction DR3. The second plurality of nanosheets NW2 may be disposed on the active pattern 101. The second plurality of nanosheets NW2 may be disposed in a region where the active pattern 101 and the second gate electrode G2 intersect each other. The second plurality of nanosheet sNW2 may be spaced apart from the first plurality of nanosheets NW1 in the first horizontal direction DR1. The second plurality of nanosheets NW2 may include a plurality of nanosheets stacked on top of each other and spaced apart from each other in the vertical direction DR3.

In FIG. 2 and FIG. 3, an example is illustrated in which each of the first and second pluralities of nanosheets NW1 and NW2 includes three nanosheets stacked on top of each other and spaced apart from each other in the vertical direction DR3. However, this is for convenience of illustration, and the present disclosure is not limited thereto. In some further embodiments, each of the first and second pluralities of nanosheets NW1 and NW2 may include more or less than three nanosheets stacked on top of each other and spaced apart from each other in a vertical direction DR3.

The first gate electrode G1 may extend in the second horizontal direction DR2 while being disposed on the active pattern 101 and the field insulating layer 105. The first gate electrode G1 may surround the first plurality of nanosheets NW1. The second gate electrode G2 may extend in the second horizontal direction DR2 while being disposed on the active pattern 101 and the field insulating layer 105. The second gate electrode G2 may be spaced apart from the first gate electrode G1 in the first horizontal direction DR1. The second gate electrode G2 may surround the second plurality of nanosheets NW2.

Each of the first and second gate electrodes G1 and G2 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) or combinations thereof. The present disclosure is not limited thereto. The gate electrode G may include a conductive metal oxide, a conductive metal oxynitride, and the like or may include oxidized products of the above-mentioned materials.

The gate spacer 111 may extend in the second horizontal direction DR2 and along opposite sidewalls of the first gate electrode G1 while being disposed on the field insulating layer 105 and an upper surface of the uppermost nanosheet among the first plurality of nanosheets NW1. Further, the gate spacer 111 may extend in the second horizontal direction DR2 and along opposite sidewalls of the second gate electrode G2 while being disposed on the field insulating layer 105 and an upper surface of the uppermost nanosheet among the second plurality of nanosheets NW2. The gate spacer 111 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or combinations thereof. However, the present disclosure is not limited thereto.

The gate insulating layer 112 may be disposed between each of the first and second gate electrodes G1 and G2 and the gate spacer 111. The gate insulating layer 112 may be disposed between each of the first and second gate electrodes G1 and G2 and the active pattern 101. The gate insulating layer 112 may be disposed between each of the first and second gate electrodes G1 and G2 and the field insulating layer 105. The gate insulating layer 112 may be disposed between the first gate electrode G1 and each of the first plurality of nanosheets NW1. The gate insulating layer 112 may be disposed between the second gate electrode G2 and each of the second plurality of nanosheets NW2.

The gate insulating layer 112 may be disposed on each of opposite sidewalls in the first horizontal direction DR1 of the first gate electrode G1, and between the field insulating layer 105 and the lowest nanosheet among the first plurality of nanosheets NW1. The gate insulating layer 112 may be disposed on each of opposite sidewalls in the first horizontal direction DR1 of the first gate electrode G1 and between adjacent ones of the first plurality of nanosheets NW1. The gate insulating layer 112 may be disposed on each of opposite sidewalls in the first horizontal direction DR1 of the second gate electrode G2, and between the field insulating layer 105 and the lowest nanosheet among the second plurality of nanosheets NW2. The gate insulating layer 112 may be disposed on each of opposite sidewalls in the first horizontal direction DR1 of the second gate electrode G2 and between adjacent ones of the second plurality of nanosheets NW2.

The gate insulating layer 112 may include at least one of silicon oxide, silicon oxynitride, silicon nitride, or a high dielectric constant material having a higher dielectric constant than that of silicon oxide. The high dielectric constant material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some further embodiments may include a negative capacitance (NC) FET using a negative capacitor. For example, the gate insulating layer 112 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further include doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant included in the ferroelectric material film may vary depending on a type of the ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include about 3 to about 8 at % (atomic %) of aluminum. In this connection, a content of the dopant may be a content of aluminum based on a sum of hafnium and aluminum.

When the dopant is silicon (Si), the ferroelectric material film may include about 2 to about 10 at % of silicon. When the dopant is yttrium (Y), the ferroelectric material film may include about 2 to about 10 at % yttrium. When the dopant is gadolinium (Gd), the ferroelectric material film may include about 1 to about 7 at % gadolinium. When the dopant is zirconium (Zr), the ferroelectric material film may include about 50 to about 80 at % zirconium.

The paraelectric material film may have paraelectric properties. The paraelectric material film may include, for example, at least one of silicon oxide and metal oxide having a high dielectric constant. Although the metal oxide included in the paraelectric material film may include, for example, at least one of hafnium oxide, zirconium oxide and aluminum oxide. However, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide included in the ferroelectric material film is different from a crystal structure of hafnium oxide included in the paraelectric material film.

The ferroelectric material film may have a thickness sized to exhibit ferroelectric properties. Although the thickness of the ferroelectric material film may be, for example, in a range of about 0.5 to about 10 nm, the present disclosure is not limited thereto. Because a critical thickness exhibiting the ferroelectric properties may vary based on a type of the ferroelectric material, the thickness of the ferroelectric material film may vary depending on the type of the ferroelectric material.

In one example, the gate insulating layer 112 may include one ferroelectric material layer. In another example, the gate insulating layer 112 may include a plurality of ferroelectric material films spaced apart from each other. The gate insulating layer 112 may have a stack film structure in which a plurality of ferroelectric material films and a plurality of paraelectric material films are alternately stacked on top of each other.

The capping pattern 113 may extend in the second horizontal direction DR2 while being disposed on each of the first gate electrode G1, the gate insulating layer 112 and the gate spacer 111. Further, the capping pattern 113 may extend in the second horizontal direction DR2 while being disposed on each of the second gate electrode G2, the gate insulating layer 112, and the gate spacer 111. For example, the capping pattern 113 may be in contact with an upper surface of the gate spacer 111. However, the present disclosure is not limited thereto. In some further embodiments, the capping pattern 113 may be disposed between the gate spacers 111.

The capping pattern 113 may include, for example, at least one of silicon nitride (SiN), silicon oxynitride (SiON), silicon oxide (SiO$_2$), silicon carbonitride (SiCN), silicon oxycarbonitride (SiOCN), or combinations thereof. However, the present disclosure is not limited thereto.

A source/drain trench ST may be formed on the active pattern 101 and on at least one side of each of the first and second gate electrodes G1 and G2. For example, the source/drain trench ST may be disposed between the first gate electrode G1 and the second gate electrode G2 while being disposed on the active pattern 101. For example, the source/drain trench ST may extend into the active pattern 101.

For example, the source/drain trench ST may be formed between the field insulating layer 105 and the lowest nanosheet, among the first plurality of nanosheets NW1, and may be recessed toward the first gate electrode G1. The source/drain trench ST may be formed between adjacent ones of the first plurality of nanosheets NW1 so as to be recessed toward the first gate electrode G1. Further, the source/drain trench ST may be formed between the lowest nanosheet, among the second plurality of nanosheets NW2, and the field insulating layer 105, and may be recessed toward the second gate electrode G2. The source/drain trench ST may be formed between adjacent ones of the second plurality of nanosheets NW2, and may be recessed toward the second gate electrode G2.

For example, each of opposite sidewalls in the first horizontal direction DR1 of each of the first and second pluralities of nanosheets NW1 and NW2 may be exposed through the source/drain trench ST. For example, a portion of the gate insulating layer 112 disposed on each of opposite sidewalls in the first horizontal direction DR1 of the first gate electrode G1 and between adjacent ones of the first plurality of nanosheets NW1 may be exposed through the source/drain trench ST. Further, a portion of the gate insulating layer 112 disposed on each of opposite sidewalls in the first horizontal direction DR1 of the second gate electrode G2 and between adjacent ones of the second plurality of nanosheets NW2 may be exposed through the source/drain trench ST.

The source/drain region 120 may be disposed in the source/drain trench ST. The source/drain region 120 may contact each of opposite sidewalls in the first horizontal direction DR1 of each of the first and second pluralities of nanosheets NW1 and NW2. For example, an upper surface of the source/drain region 120 may be positioned at a higher level than that of an upper surface of the uppermost nanosheet of each of the first and second pluralities of nanosheets NW1 and NW2. However, the present disclosure is not limited thereto.

For example, the source/drain region 120 may contact a portion of the gate insulating layer 112 disposed on each of opposite sidewalls in the first horizontal direction DR1 of the first gate electrode G1, and between the field insulating layer 105 and the lowest nanosheet among the first plurality of nanosheets NW1. The source/drain region 120 may contact a portion of the gate insulating layer 112 disposed on each of opposite sidewalls in the first horizontal direction DR1 of the first gate electrode G1 and between adjacent ones of the first plurality of nanosheets NW1. For example, the source/drain region 120 may contact a portion of the gate insulating layer 112 disposed on each of opposite sidewalls in the first horizontal direction DR1 of the second gate electrode G2, and between the field insulating layer 105 and the lowest nanosheet among the second plurality of nanosheets NW2. The source/drain region 120 may contact a portion of the gate insulating layer 112 disposed on each of opposite sidewalls in the first horizontal direction DR1 of the second gate electrode G2 and between adjacent ones of the second plurality of nanosheets NW2.

The source/drain region 120 may include first to third layers 121, 122, and 123. The first layer 121 may continuously extend along a sidewall and a bottom surface of the source/drain trench ST. For example, the first layer 121 may extend to the upper surface of the uppermost nanosheet among the first plurality of nanosheets NW1. Further, the first layer 121 may extend to the upper surface of the uppermost nanosheet among the second plurality of nanosheets NW2. The first layer 121 may overlap the uppermost nanosheet of each of the first and second pluralities of nanosheets NW1 and NW2 in the first horizontal direction DR1.

The first layer 121 may be in contact with each of opposite sidewalls in the first horizontal direction DR1 of each of the first and second pluralities of nanosheets NW1 and NW2. The first layer 121 may be in contact with the active pattern 101. The first layer 121 may be in contact with a bottom surface of the gate spacer 111. However, the present disclosure is not limited thereto. For example, the first layer 121 may fill a space recessed toward the first gate electrode G1 and defined between the field insulating layer 105 and the bottommost nanosheet among the first plurality of nanosheets NW1. The first layer 121 may fill a space recessed toward the first gate electrode G1 and defined between adjacent ones of the first plurality of nanosheets NW1. The first layer 121 may fill a space recessed toward the second gate electrode G2 and defined between the field insulating layer 105 and the bottommost nanosheet among the second plurality of nanosheets NW2. The first layer 121 may fill a space recessed toward the second gate electrode G2 and defined between adjacent ones of the second plurality of nanosheets NW2. In this regard, the first layer 121 may overlap each of the first and second pluralities of nanosheets NW1 and NW2 along the vertical direction DR3.

For example, the first layer 121 may be in contact with a portion of the gate insulating layer 112 disposed on each of opposite sidewalls in the first horizontal direction DR1 of the first gate electrode G1, and disposed between the field insulating layer 105 and the lowest nanosheet among the first plurality of nanosheets NW1. The first layer 121 may contact a portion of the gate insulating layer 112 disposed on each of opposite sidewalls in the first horizontal direction DR1 of the first gate electrode G1 and between adjacent ones of the first plurality of nanosheets NW1. For example, the first layer 121 may be in contact with a portion of the gate insulating layer 112 disposed on each of opposite sidewalls in the first horizontal direction DR1 of the second gate electrode G2, and between the field insulating layer 105 and the lowest nanosheet among the second plurality of nanosheets NW2. The first layer 121 may contact a portion of the gate insulating layer 112 disposed on each of opposite sidewalls in the first horizontal direction DR1 of the second gate electrode G2 and between adjacent ones of the second plurality of nanosheets NW2.

The first layer 121 may include, for example, silicon (Si). The first layer 121 may be embodied as an epitaxial semiconductor film. The first layer 121 may be doped with a first n-type impurity. The first n-type impurity may include, for example, one of phosphorus (P), arsenic (As), antimony (Sb), and bismuth (Bi).

The second layer 122 may be disposed on the first layer 121 and in the source/drain trench ST. The second layer 122 may continuously extend along the first layer 121. The second layer 122 may contact the first layer 121. For example, the second layer 122 may be in contact with the gate spacer 111. However, the present disclosure is not limited thereto. The second layer 122 may extend to the upper surface of the uppermost nanosheet among the second plurality of nanosheets NW2. For example, the second layer 122 may overlap the uppermost nanosheet of each of the first and second pluralities of nanosheets NW1 and NW2 in the first horizontal direction DR1.

The second layer 122 may include, for example, silicon (Si). The second layer 122 may be embodied as an epitaxial semiconductor film. The second layer 122 may be doped with an impurity different from the first n-type impurity. For example, the second layer 122 may include doped germanium (Ge).

For example, a content of germanium (Ge) doped in the second layer 122 may be in a range of 3 at % (atomic percent) to 20 at %. For example, a thickness of the second layer 122 may be in a range of 1 nm to 5 nm. For example, a dimension in the vertical direction DR3 of a bottom portion of the second layer 122 may be greater than a dimension in the first horizontal direction DR1 of a sidewall portion of the second layer 122. A position of a bottom surface of the second layer 122 as shown in FIG. 2 is an example, and the present disclosure is not limited thereto. For example, the bottom surface of the second layer 122 may overlap with the lowest nanosheet of the first plurality of nanosheets NW1 and the lowest nanosheet of the second plurality of nanosheets NW2 in the first horizontal direction DR1. In some further embodiments, the bottom surface of the second layer 122 may overlap with a portion of the gate electrode G1 disposed between the lowest nanosheet among the first plurality of nanosheets NW1 and the active pattern 101 or the gate insulating layer 112 surrounding the portion in the first horizontal direction DR1.

The third layer 123 may be disposed on the second layer 122 and in the source/drain trench ST. For example, the third layer 123 may fill a remaining portion of the source/drain trench ST and may be disposed on the second layer 122. The third layer 123 may be in contact with the second layer 122. For example, an upper surface of the third layer 123 may be positioned at a higher level than that of the upper surface of the uppermost nanosheets of each of the first and second pluralities of nanosheets NW1 and NW2. However, the present disclosure is not limited thereto. For example, the third layer 123 may overlap the uppermost nanosheet of each of the first and second pluralities of nanosheets NW1 and NW2 in the first horizontal direction DR1.

For example, the third layer 123 and the first layer 121 may be isolated from each other via the second layer 122, which may be between the first layer 121 and the third layer 123. However, the present disclosure is not limited thereto. The third layer 123 may include, for example, silicon (Si). The third layer 123 may be embodied as an epitaxial semiconductor film. The third layer 123 may be doped with a second n-type impurity. The second n-type impurity may include, for example, one of phosphorus (P), arsenic (As), antimony (Sb), and bismuth (Bi). The second n-type impurity may be an impurity different from germanium (Ge) doped in the second layer 122. The second n-type impurity may be an impurity different from the first n-type impurity included in the first layer 121. For example, the first n-type impurity may include arsenic (As), and the second n-type impurity may include (P). In another example, the second n-type impurity and the first n-type impurity may include the same material. A position of a bottom surface of the third layer 123 as shown in FIG. 2 is an example, and the present disclosure is not limited thereto. For example, the bottom surface of the third layer 123 may overlap with the lowest nanosheet among the first plurality of nanosheets NW1 and the lowest nanosheet among the second plurality of nanosheets NW2 in the first horizontal direction DR1. In some further embodiments, the bottom surface of the third layer 123 may overlap with a portion of the gate electrode G1 disposed between two nanosheets sequentially stacked on the active pattern 101 among the first plurality of nanosheets NW1 or the gate insulating layer 112 surrounding the portion in the first horizontal direction DR1.

The first interlayer insulating layer 130 may be disposed on the field insulating layer 105. The first interlayer insulating layer 130 may cover the source/drain region 120. The first interlayer insulating layer 130 may surround a sidewall of each of the gate spacer 111 and the capping pattern 113. For example, an upper surface of the first interlayer insulating layer 130 may be coplanar with an upper surface of the capping pattern 113. However, the present disclosure is not limited thereto. In some further embodiments, the first interlayer insulating layer 130 may cover the upper surface of the capping pattern 113.

The first interlayer insulating layer 130 may include, for example, at least one of silicon oxide, silicon nitride, silicon oxynitride, and a low dielectric constant (low-k) material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutoxysiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the spirit of the present disclosure is not limited thereto.

The source/drain contact CA may extend through the first interlayer insulating layer 130 in the vertical direction DR3 and thus be connected to the source/drain region 120. For example, the source/drain contact CA may extend into the third layer 123. That is, the source/drain contact CA may be connected to the third layer 123. For example, an upper surface of the source/drain contact CA may be coplanar with an upper surface of the first interlayer insulating layer 130. However, the present disclosure is not limited thereto. Although it is illustrated in FIG. 2 that the source/drain contact CA is embodied as a single layer, this is for convenience of illustration, and the present disclosure is not limited thereto. That is, the source/drain contact CA may be embodied as a multilayer. The source/drain contact CA may include a conductive material.

The silicide layer 128 may be disposed between the source/drain region 120 and the source/drain contact CA. For example, the silicide layer 128 may be disposed between the third layer 123 and the source/drain contact CA. The silicide layer 128 may be disposed in and along an interface between the source/drain region 120 and the source/drain contact CA. For example, the silicide layer 128 may be disposed in and along an interface between the third layer 123 and the source/drain contact CA. The silicide layer 128 may include, for example, a metal silicide material.

For example, the gate contact CB may extend through the capping pattern 113 in the vertical direction DR3 and may be connected to the first gate electrode G1. For example, an upper surface of the gate contact CB may be coplanar with the upper surface of the first interlayer insulating layer 130. However, the present disclosure is not limited thereto. Although it is illustrated in FIG. 3 that the gate contact CB is embodied as a single layer, this is for convenience of illustration, and the present disclosure is not limited thereto. That is, the gate contact CB may be embodied as a multilayer. The gate contact CB may include a conductive material.

The etch stop layer 140 may be disposed on an upper surface of each of the first interlayer insulating layer 130, the capping pattern 113, the gate contact CB, and the source/drain contact CA. Although it is illustrated in FIG. 2 and FIG. 3 that the etch stop layer 140 is embodied as a single film, the present disclosure is not limited thereto. In some further embodiments, the etch stop layer 140 may be embodied as a stack of multiple films. The etch stop layer 140 may include, for example, at least one of aluminum oxide, aluminum nitride, hafnium oxide, zirconium oxide, silicon oxide, silicon nitride, silicon oxynitride, and a low dielectric constant material. The second interlayer insulating layer 150 may be disposed on the etch stop layer 140. The second interlayer insulating layer 150 may include, for example, at least one of silicon oxide, silicon nitride, silicon oxynitride, and a low dielectric constant material.

The first via V1 may extend through the second interlayer insulating layer 150 and the etch stop layer 140 in the vertical direction DR3 and may be connected to the source/drain contact CA. The second via V2 may extend through the second interlayer insulating layer 150 and the etch stop layer 140 in the vertical direction DR3 and may be connected to the gate contact CB. Although it is illustrated in FIG. 2 and FIG. 3 that each of the first via V1 and the second via V2 is embodied as a single layer, this is for convenience of illustration, and the present disclosure is not limited thereto. That is, each of the first via V1 and the second via V2 may be embodied as a multilayer. Each of the first via V1 and the second via V2 may include a conductive material.

A transistor formed in the NMOS region of the semiconductor device according to some embodiments includes the source/drain region 120 including the first to third layers 121, 122, and 123 which are sequentially stacked. In this regard, the second layer 122, as the middle layer disposed between the first and third layers 121 and 123, may include doped germanium (Ge), such that the third layer 123 as a filling layer may have improved gap fill. Thus, in the semiconductor device according to some embodiments, formation of an air gap in the source/drain region 120 in the transistor formed in the NMOS region may be prevented, or a size of the air gap may be reduced, thereby improving the reliability of the semiconductor device.

Hereinafter, a method of manufacturing a semiconductor device according to some embodiments will be described with reference to FIG. 2 to FIG. 19.

FIG. 4 to FIG. 19 are diagrams of intermediate structures corresponding to intermediate operations illustrating a method of manufacturing a semiconductor device according to some embodiments.

Figure 4:
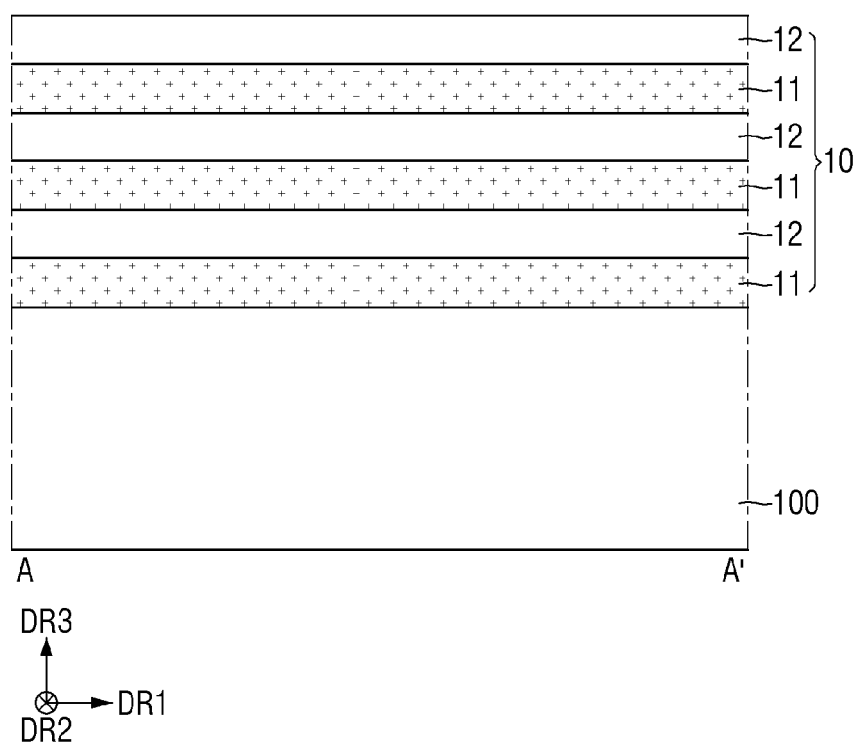
FIG. 4 to FIG. 19 are diagrams of intermediate structures corresponding to intermediate operations illustrating a method of manufacturing a semiconductor device according to some embodiments.

Referring to FIG. 4, a stack structure 10 may be formed on the substrate 100. The stack structure 10 may include sacrificial layers 11 and semiconductor layers 12 alternately stacked on top of each other while being disposed on the substrate 100. For example, a sacrificial layer 11 may constitute a bottommost portion of the stack structure 10, and a semiconductor layer 12 may constitute an uppermost portion of the stack structure 10. However, the present disclosure is not limited thereto. In some further embodiments, a sacrificial layer 11 may constitute the uppermost portion of the stack structure 10. The sacrificial layers 11 may include, for example, silicon germanium (SiGe). The semiconductor layers 12 may include, for example, silicon (Si).

Figure 5:
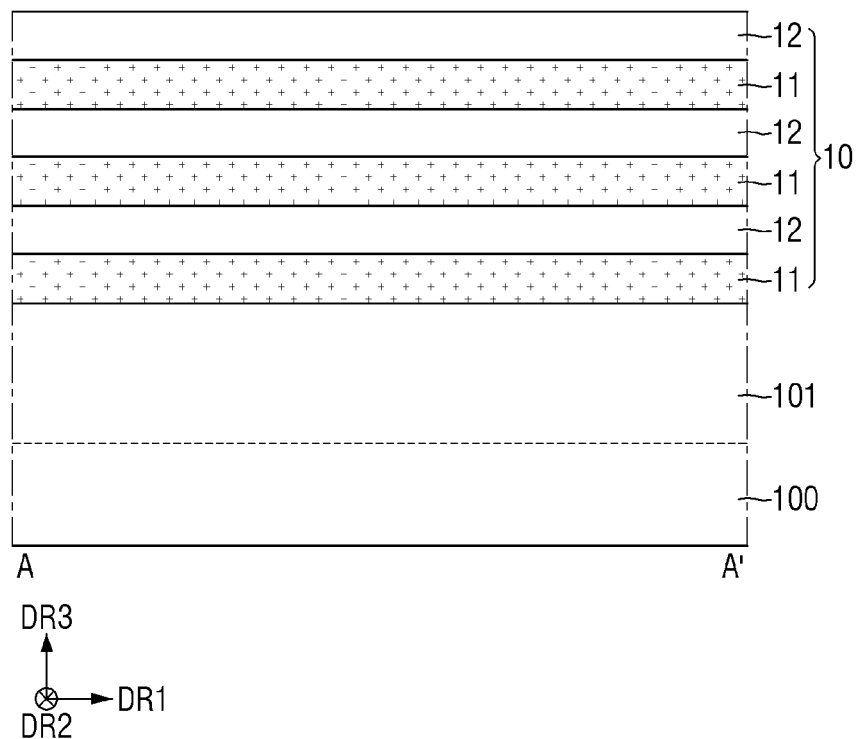
Figure 6:
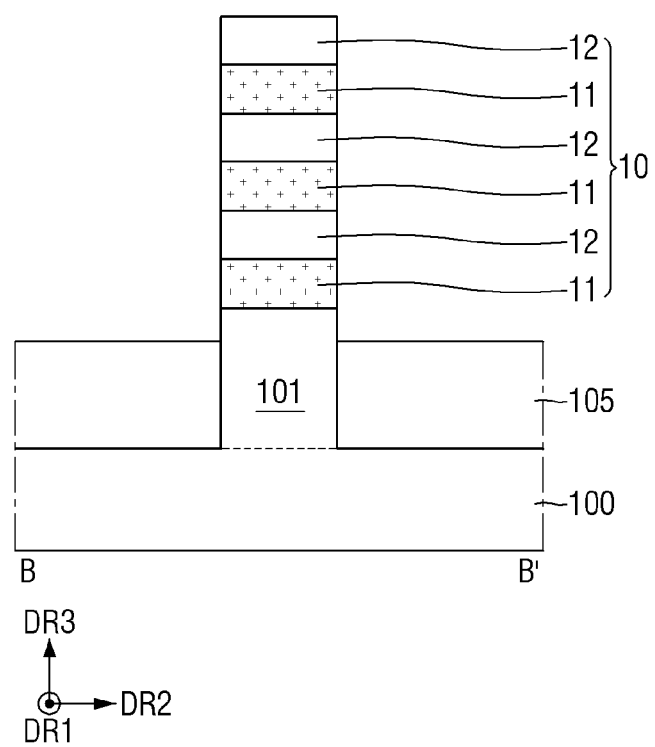

Referring to FIG. 5 and FIG. 6, a portion of the stack structure 10 may be etched. A portion of the substrate 100 may be etched while the stack structure 10 is being partially etched. In this etching process, the active pattern 101 may be defined under the stack structure 10 while being disposed on an upper surface of the substrate 100. The active pattern 101 may extend in the first horizontal direction DR1.

The field insulating layer 105 may be formed on the upper surface of the substrate 100. The field insulating layer 105 may surround a sidewall of the active pattern 101. For example, the upper surface of the active pattern 101 may be positioned at a higher level than that of the upper surface of the field insulating layer 105.

Figure 7:
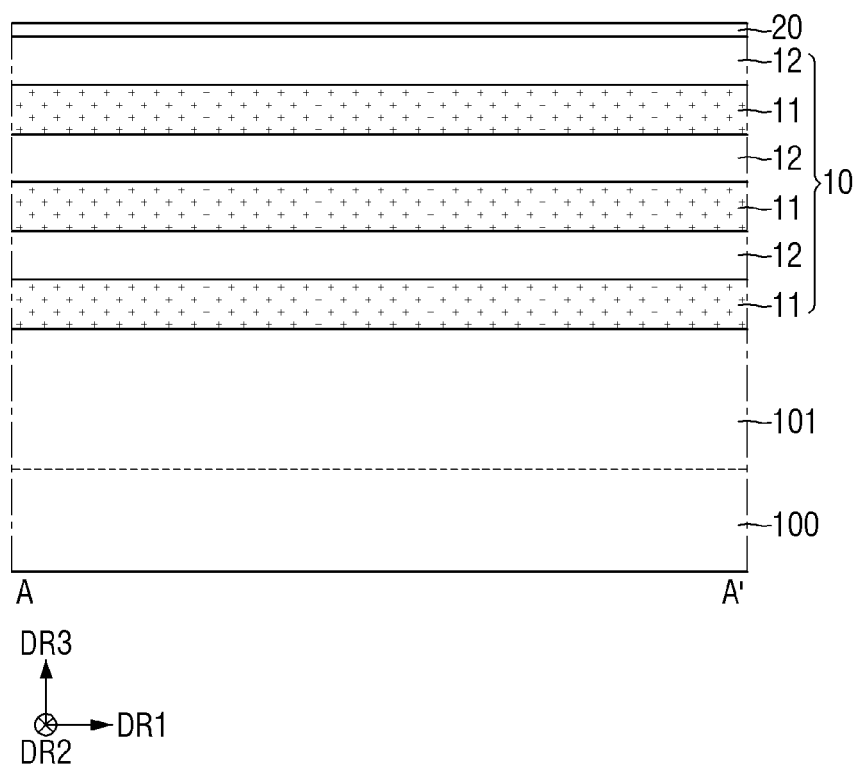
Figure 8:
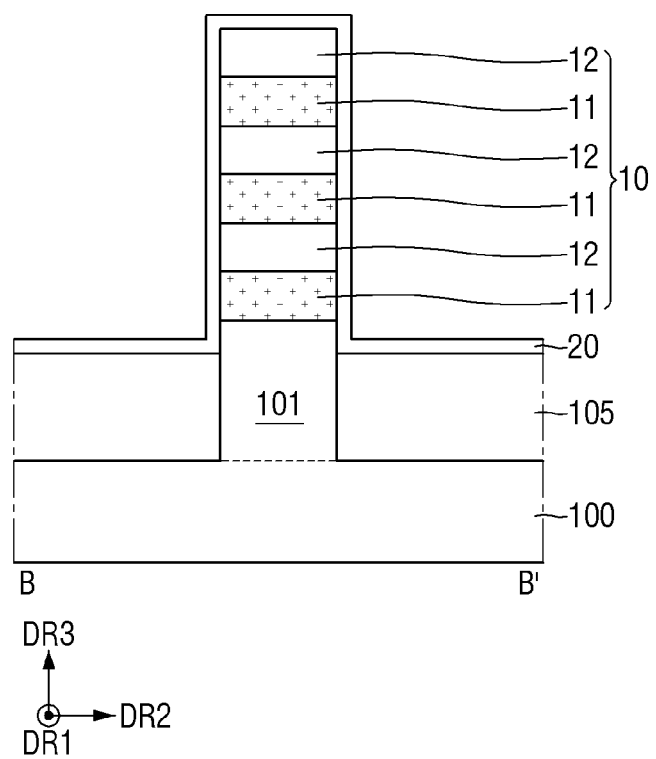

Referring to FIG. 7 and FIG. 8, a pad oxide layer 20 may be formed on, and may cover, an upper surface of the field insulating layer 105, an exposed sidewall of the active pattern 101, and an exposed sidewall and an exposed upper surface of the stack structure 10. For example, the pad oxide layer 20 may be conformally formed. The pad oxide layer 20 may include, for example, silicon oxide ($SiO_2$).

Figure 9:
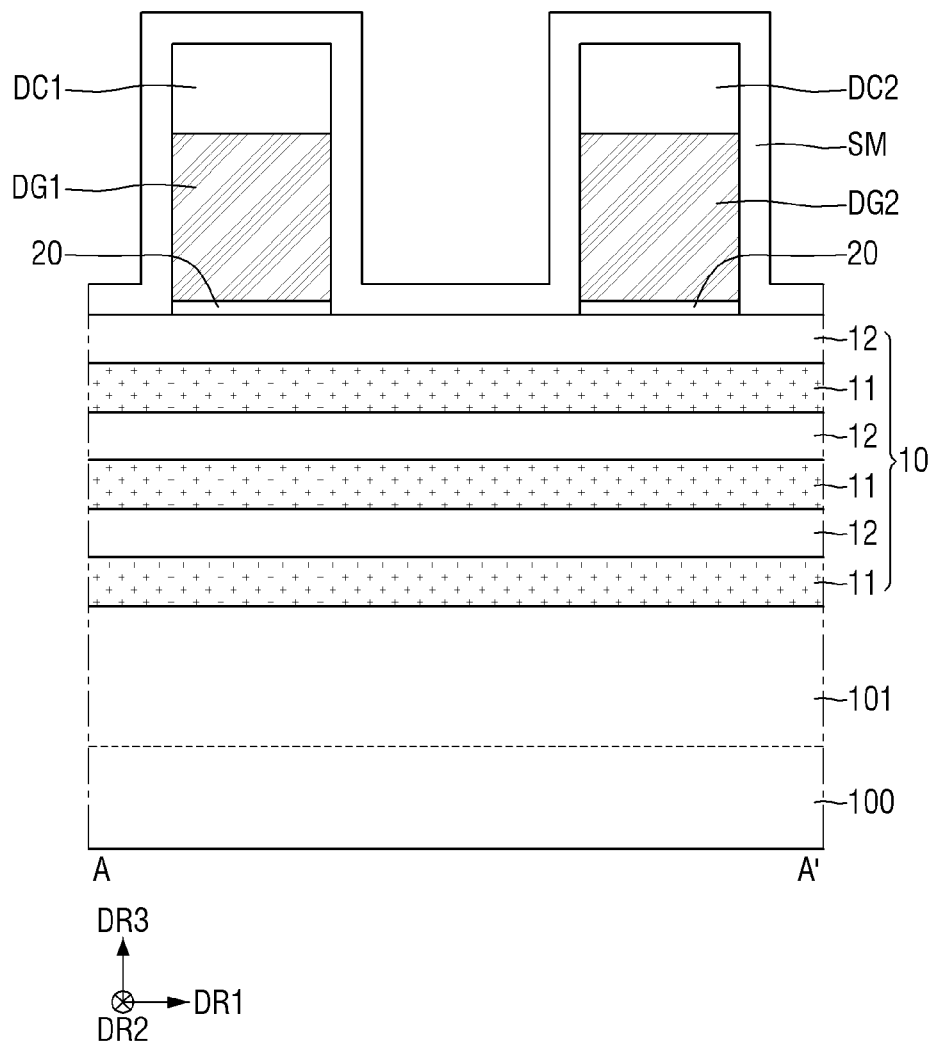
Figure 10:
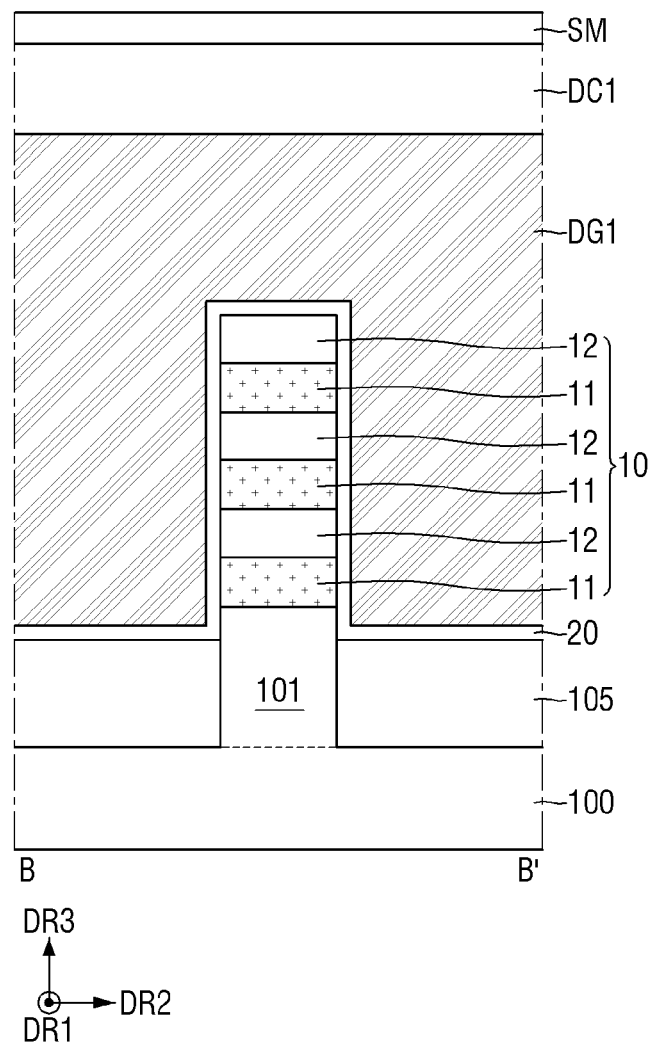

Referring to FIG. 9 and FIG. 10, first and second dummy gates DG1 and DG2 and first and second dummy capping patterns DC1 and DC2 extending in the second horizontal direction DR2 may be formed on the stack structure 10 and the field insulating layer 105 while being disposed on the pad oxide layer 20. The first dummy capping pattern DC1 may be formed on the first dummy gate DG1. Further, the second dummy capping pattern DC2 may be formed on the second dummy gate DG2. Each of the second dummy gate DG2 and the second dummy capping pattern DC2 may be spaced apart from each of the first dummy gate DG1 and the first dummy capping pattern DC1 in the first horizontal direction DR1 and be formed in the same layer as that of each of the first dummy gate DG1 and the first dummy capping pattern DC1.

While the first and second dummy gates DG1 and DG2 and the first and second dummy capping patterns DC1 and DC2 are being formed, a remaining portion of the pad oxide layer 20 other than a portion thereof overlapping each of the first and second dummy gates DG1 and DG2 in the vertical direction DR3 while being disposed on the substrate 100 may be removed.

A spacer material layer SM may be formed to cover a sidewall of each of the first and second dummy gates DG1 and DG2, a sidewall and an upper surface of each of the first and second dummy capping patterns DC1 and DC2, an exposed sidewall and an exposed upper surface of the stack structure 10, and an exposed upper surface of the field insulating layer 105. For example, the spacer material layer SM may be formed conformally. The spacer material layer SM may include, for example, at least one of silicon nitride (SiN), silicon oxycarbonitride (SiOCN), silicon boron carbonitride (SiBCN), silicon carbonitride SiCN, silicon oxynitride (SiON), or combinations thereof.

Figure 11:
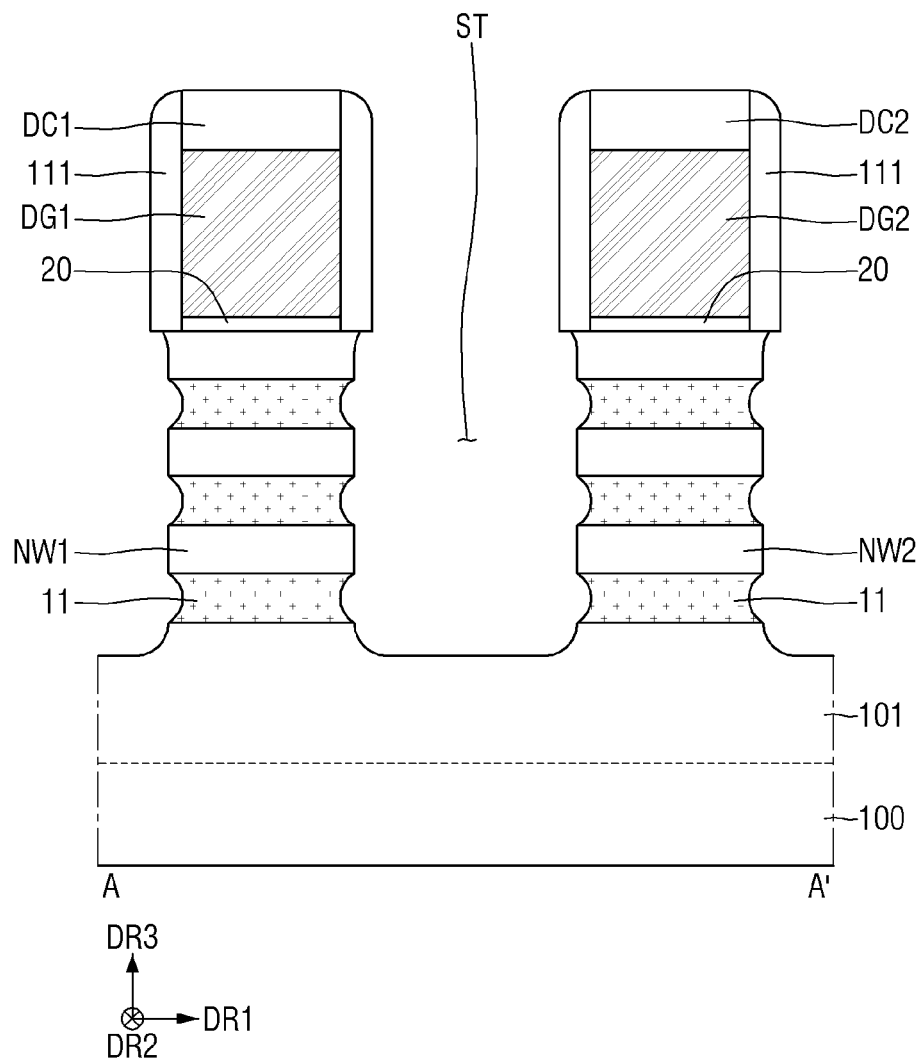

Referring to FIG. 11, the stack structure (10 of FIG. 9 and FIG. 10) may be etched using the first and second dummy capping patterns DC1 and DC2 and the first and second dummy gates DG1 and DG2 as masks, thereby forming the source/drain trench ST. For example, the source/drain trench ST may extend into the active pattern 101.

While the source/drain trench ST is being formed, a portion of the first and second dummy capping patterns DC1 and DC2 and a portion of the spacer material layer (SM of FIG. 9 and FIG. 10) formed on an upper surface of each of the first and second dummy capping patterns DC1 and DC2 may be removed. A portion of the spacer material layer (SM of FIG. 9 and FIG. 10) remaining on a sidewall of each of the first and second dummy capping patterns DC1 and DC2 and the first and second dummy gates DG1 and DG2 may be defined as the gate spacer 111. A portion of the semiconductor layer (12 in FIG. 9 and FIG. 10) remaining under the first dummy gate DG1 after the source/drain trench ST has been formed may be defined as the first plurality of nanosheets NW1. Further, a portion of the semiconductor layer (12 in FIG. 9 and FIG. 10) remaining under the second dummy gate DG2 after the source/drain trench ST has been formed may be defined as the second plurality of nanosheets NW2.

For example, while the source/drain trench ST is being formed, the sacrificial layer 11 may be etched by a larger amount than an amount by which the semiconductor layer (12 in FIG. 9 and FIG. 10) was etched. Accordingly, a sidewall of the sacrificial layer 11 may be formed to be inwardly recessed beyond a sidewall of each of the first and second pluralities of nanosheets NW1 and NW2.

Figure 12:
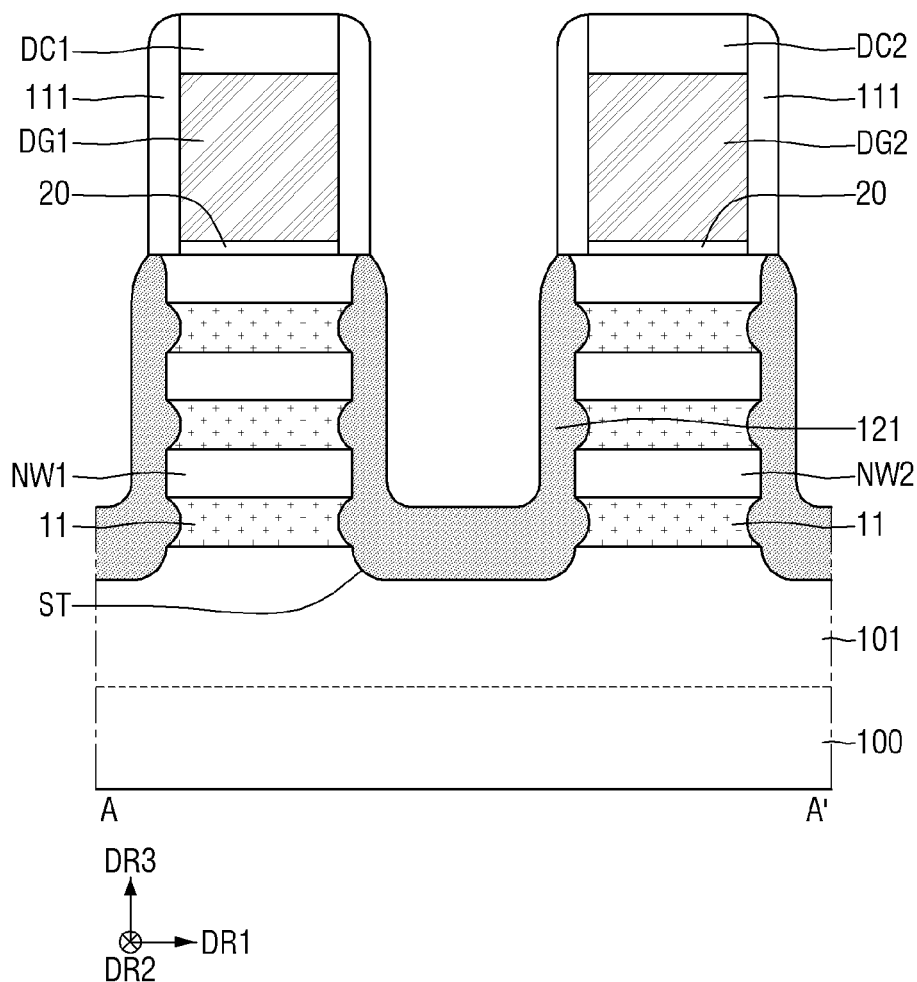

Referring to FIG. 12, the first layer 121 may be continuously formed along a sidewall and a bottom surface of the source/drain trench ST. The first layer 121 may be in contact with a sidewall of each sacrificial layer 11 and a sidewall of each of the first and second pluralities of nanosheets NW1 and NW2. For example, the first layer 121 may extend to the upper surface of the uppermost nanosheet of each of the first and second pluralities of nanosheets NW1 and NW2. For example, the first layer 121 may overlap each of the first and second pluralities of nanosheets NW1 and NW2 along the vertical direction DR3.

The first layer 121 may be epitaxially grown. The first layer 121 may include, for example, silicon (Si). The first layer 121 may include the doped first n-type impurity. The first n-type impurity may include, for example, one of phosphorus (P), arsenic (As), antimony (Sb), and bismuth (Bi).

Figure 13:
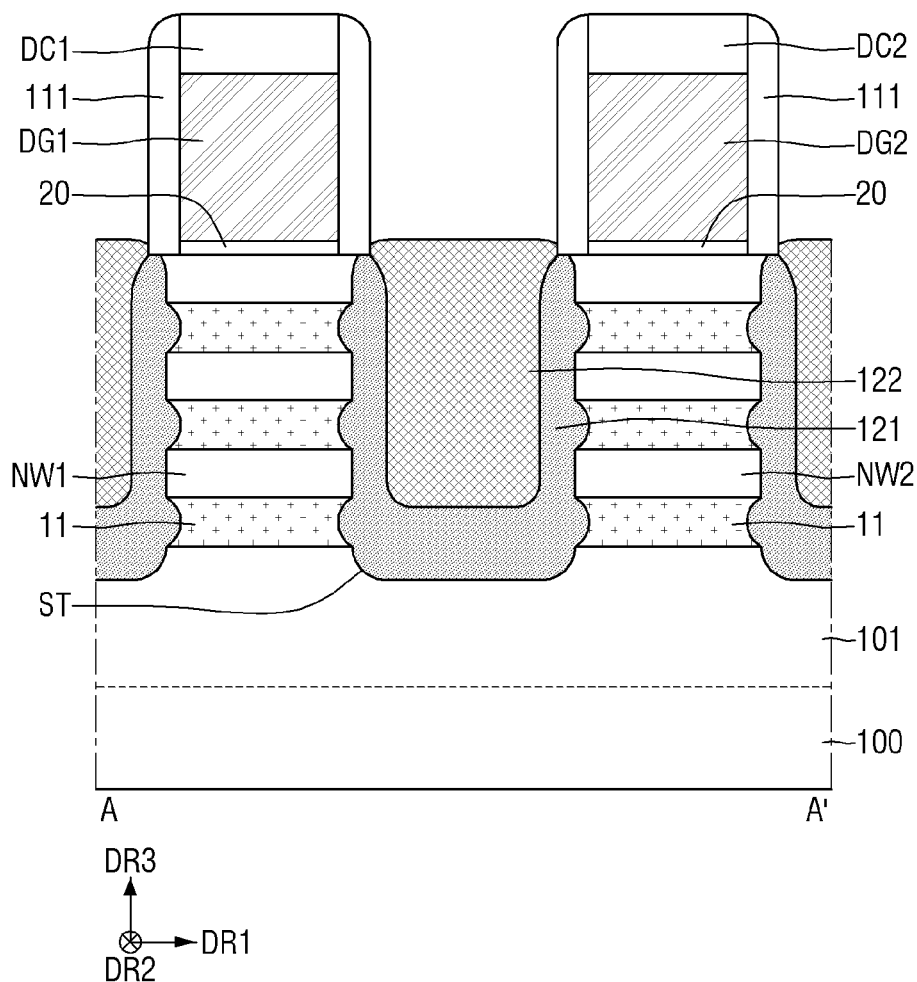

Referring to FIG. 13, the second layer 122 may be formed on the first layer 121 and in the source/drain trench ST. For example, the second layer 122 may fill a remaining portion of the source/drain trench ST while being disposed on the first layer 121. For example, an upper surface of the second layer 122 may be positioned at a higher level than that of an upper surface of the uppermost nanosheet of each of the first and second pluralities of nanosheets NW1 and NW2. However, the present disclosure is not limited thereto.

The second layer 122 may be epitaxially grown. The second layer 122 may include, for example, silicon (Si). The second layer 122 may be doped with an impurity different from the first n-type impurity. For example, the second layer 122 may include doped germanium (Ge).

Figure 14:
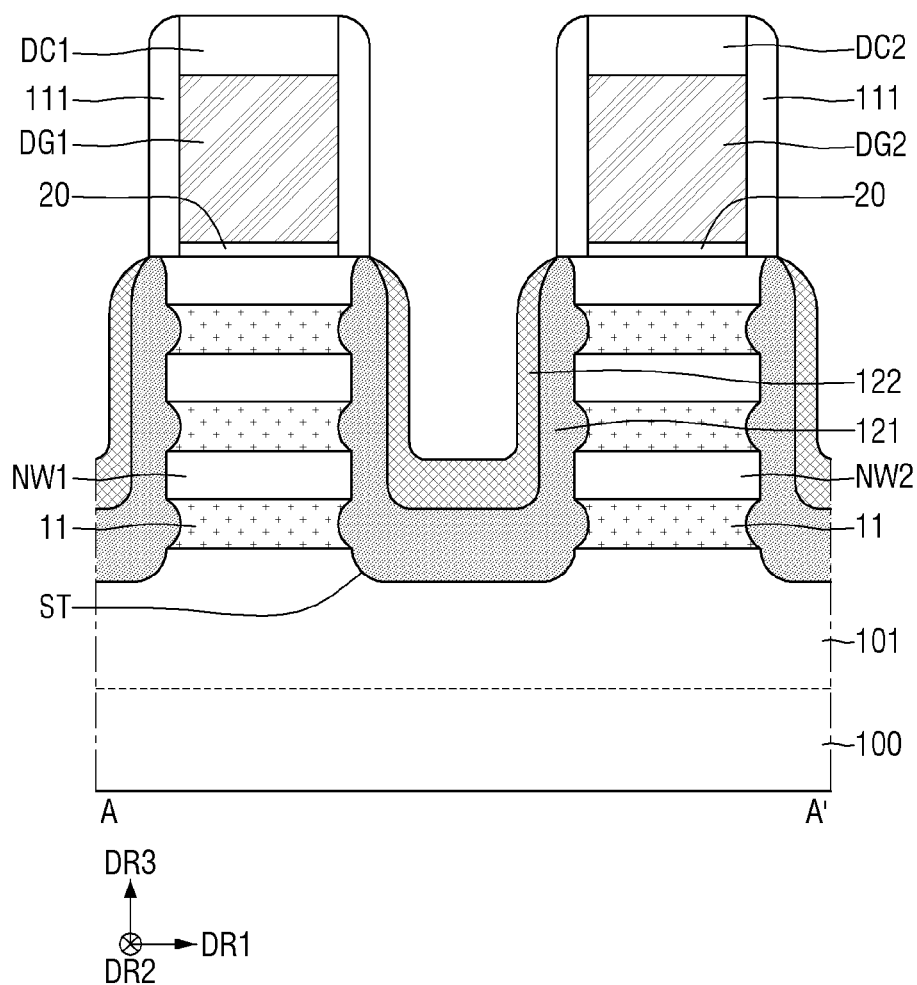

Referring to FIG. 14, a portion of the second layer 122 may be etched. A remaining second layer 122 after the etching process has been performed may be continuously formed along an inner wall of the first layer 121. For example, the remaining second layer 122 may extend to the upper surface of the uppermost nanosheet of each of the first and second pluralities of nanosheets NW1 and NW2. However, the present disclosure is not limited thereto.

For example, the process of forming the second layer 122 as shown in FIG. 13 and the process of etching the portion of the second layer 122 as shown in FIG. 14 may be repeatedly formed. Thus, distribution of germanium (Ge) doped into the second layer 122 may be controlled to be uniform.

Figure 15:
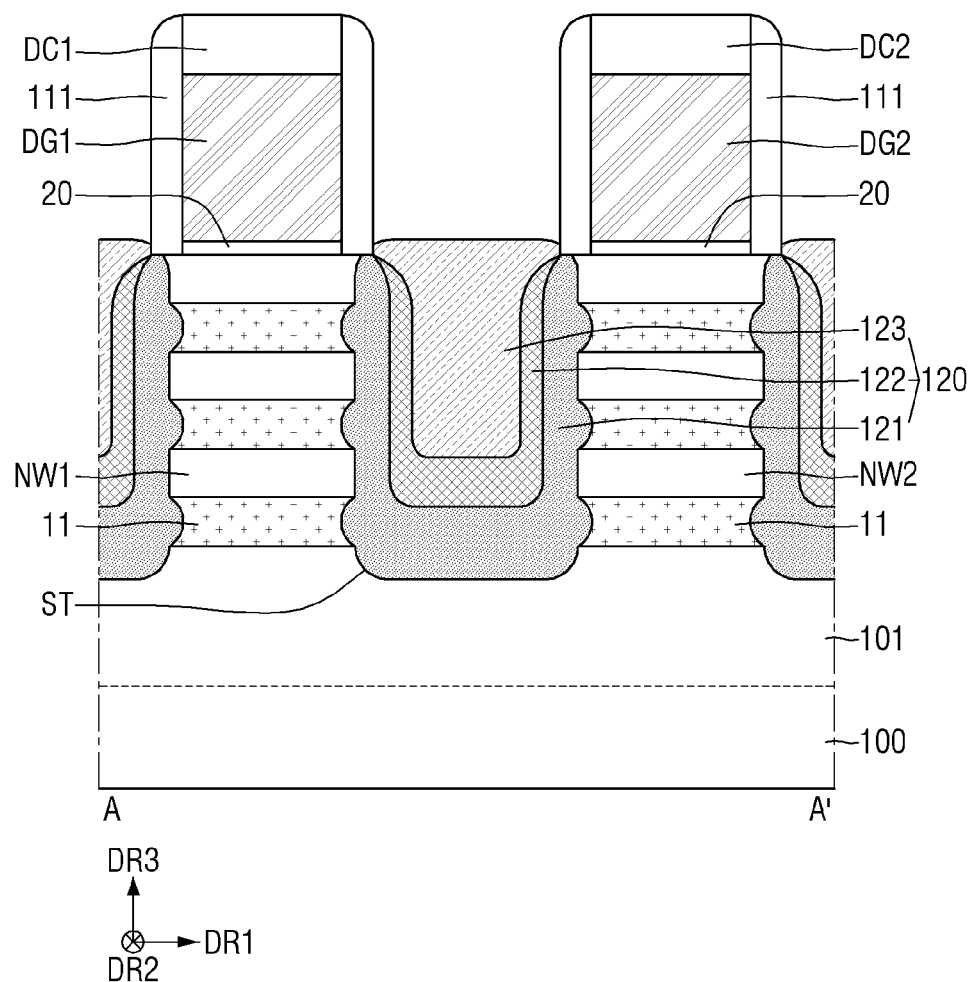

Referring to FIG. 15, the third layer 123 may be formed to fill a remaining portion of the source/drain trench ST while being disposed on the second layer 122. For example, the upper surface of the third layer 123 may be positioned at a higher level than that of the upper surface of the uppermost nanosheet of each of the first and second pluralities of nanosheets NW1 and NW2. However, the technical concept of the present disclosure is not limited thereto.

The third layer 123 may be epitaxially grown. The third layer 123 may include, for example, silicon (Si). The third layer 123 may include the doped second n-type impurity. The second n-type impurity may be an impurity different from the germanium (Ge) doped into the second layer 122. The second n-type impurity may include, for example, (P).

Figure 16:
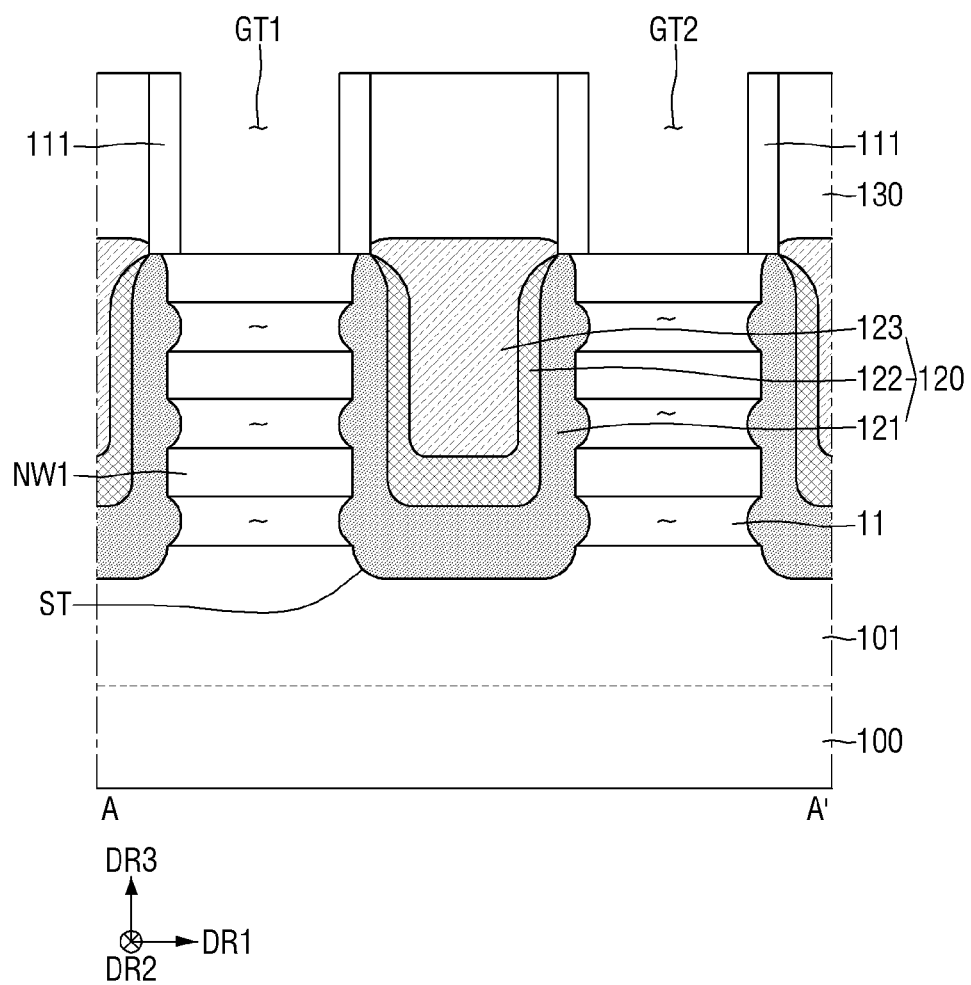
Figure 17:
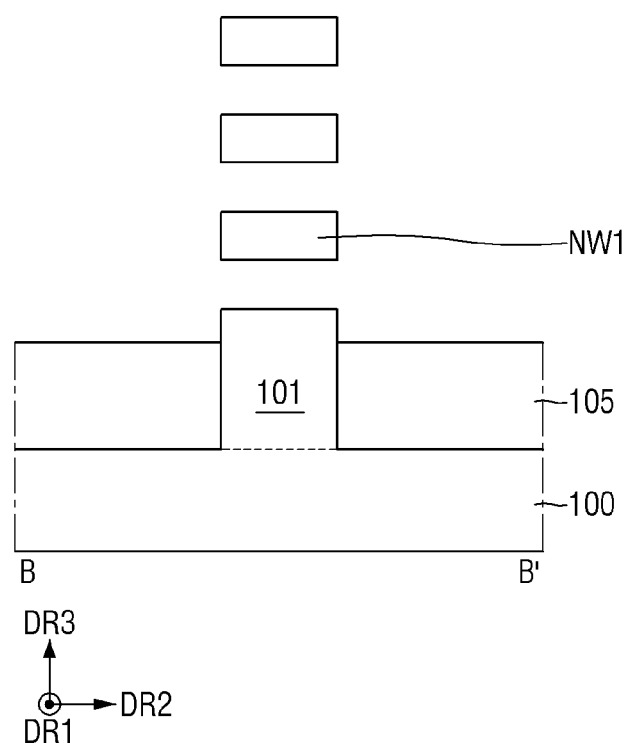

Referring to FIG. 16 and FIG. 17, the first interlayer insulating layer 130 may be formed to cover a sidewall and an upper surface of the source/drain region SD, and each of the gate spacer 111, and the first and second dummy capping patterns (DC1 and DC2 of FIG. 15). An upper surface of each of the first and second dummy gates (DG1 and DG2 in FIG. 15) may be exposed via a planarization process. The first and second dummy gates (DG1 and DG2 of FIG. 15), the pad oxide layer (20 in FIG. 15), and the sacrificial layer (11 in FIG. 15) may be removed. The first dummy gate (DG1 in FIG. 15) may be removed to form a first gate trench GT1. Further, the second dummy gate (DG2 in FIG. 15) may be removed to form a second gate trench GT2.

Figure 18:
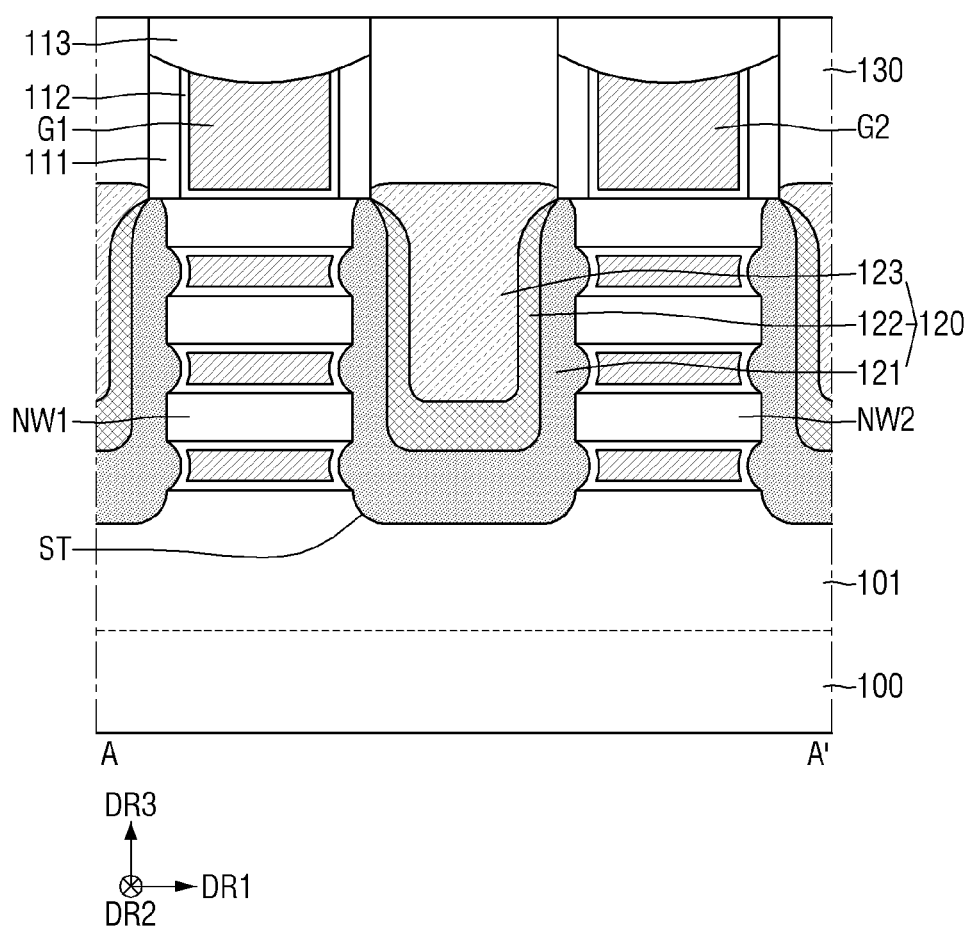
Figure 19:
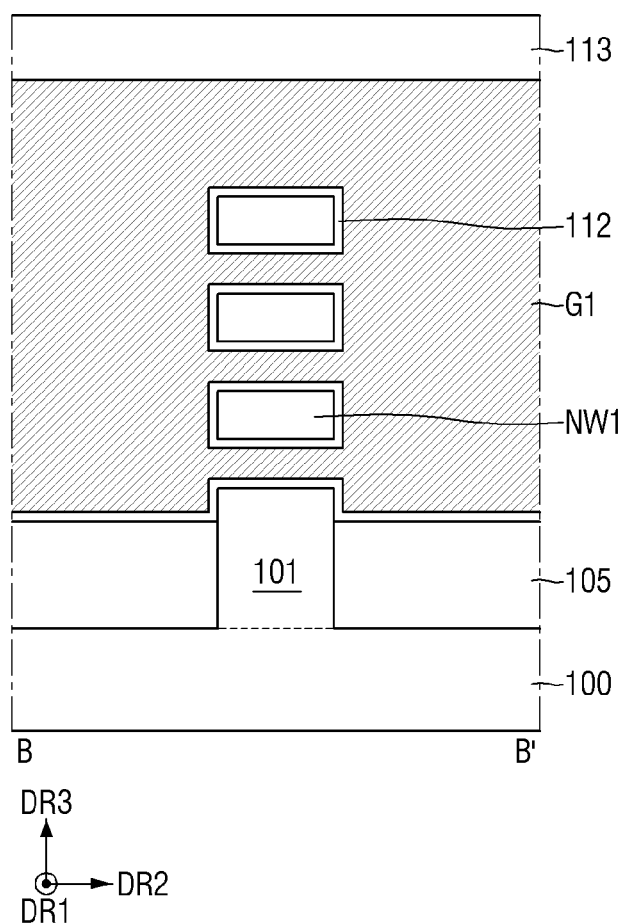

Referring to FIG. 18 and FIG. 19, the gate insulating layer 112 may be formed in a space obtained via the removal of each of the first and second dummy gates (DG1 and DG2 in FIG. 15), the pad oxide layer (20 in FIG. 15) and the sacrificial layer (11 in FIG. 15). For example, the gate insulating layer 112 may be formed conformally.

In the space obtained via the removal of each of the first and second dummy gates (DG1 and DG2 in FIG. 15), the pad oxide layer (20 in FIG. 15) and the sacrificial layer (11 in FIG. 15), the first gate electrode G1 may be formed on the gate insulating layer 112. The first gate electrode G1 may be formed on the gate insulating layer 112 and received in the first gate trench GT1. Further, the first gate electrode G1 may surround each of the first nanosheets NW1. At the same time, in the space obtained via the removal of each of the first and second dummy gates (DG1 and DG2 in FIG. 15), the pad oxide layer (20 in FIG. 15) and the sacrificial layer (11 in FIG. 15), the second electrode G2 may be formed on the gate insulating layer 112. The second gate electrode G2 may be formed on the gate insulating layer 112 and received in the second gate trench GT2. Further, the second gate electrode G2 may surround each of the second nanosheets NW2.

A top portion of each of the gate spacer 111, the gate insulating layer 112, and the first and second gate electrodes G1 and G2 may be etched. The capping pattern 113 may be formed in a space obtained via the removal of the top portion of each of the gate spacer 111, the gate insulating layer 112, and the first and second gate electrodes G1 and G2. For example, an upper surface of the capping pattern 113 may be coplanar with an upper surface of the first interlayer insulating layer 130. However, the present disclosure is not limited thereto.

Referring to FIG. 2 and FIG. 3, the gate contact CB extending through the capping pattern 113 in the vertical direction DR3 and connected to the first gate electrode G1 may be formed. Further, the source/drain contact CA extending through the first interlayer insulating layer 130 in the vertical direction DR3 and connected to the source/drain region 120 may be formed. The silicide layer 128 may be formed between the source/drain region 120 and the source/drain contact CA.

The etch stop layer 140 and the second interlayer insulating layer 150 may be sequentially formed on an upper surface of each of the first interlayer insulating layer 130, the capping pattern 113, the gate contact CB, and the source/drain contact CA. The first via V1 extending through the second interlayer insulating layer 150 and the etch stop layer 140 in the vertical direction DR3 and connected to the source/drain contact CA may be formed. Further, the second via V2 extending through the second interlayer insulating layer 150 and the etch stop layer 140 in the vertical direction DR3 and connected to the gate contact CB may be formed. In the above manufacturing process, the semiconductor device as shown in FIG. 2 and FIG. 3 may be manufactured.

Hereinafter, a semiconductor device according to some further embodiments will be described with reference to FIG. 20. Following description will be based on differences thereof from the semiconductor device as shown in FIG. 1 to FIG. 3.

Figure 20:
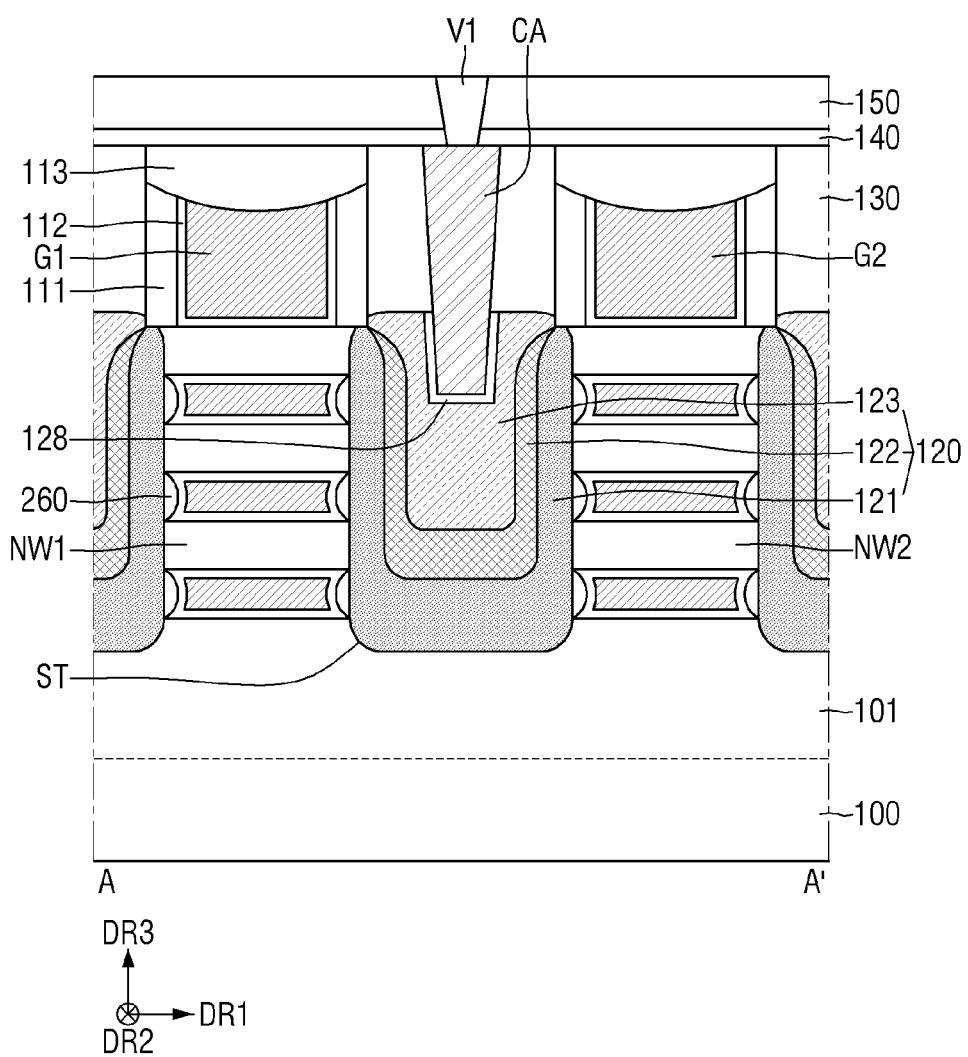
FIG. 20 is a cross-sectional view illustrating a semiconductor device according to some further embodiments.

FIG. 20 is a cross-sectional view illustrating a semiconductor device according to some further embodiments.

Referring to FIG. 20, in the semiconductor device according to some further embodiments, an inner spacer 260 may be disposed between the first gate electrode G1 and the source/drain region 120, and between the second gate electrode G2 and the source/drain region 120.

For example, the inner spacer 260 may be disposed between the active pattern 101 and the lowest nanosheet among the first plurality of nanosheets NW1, and between the gate insulating layer 112 and the first layer 121. The inner spacer 260 may be disposed between adjacent ones of the first plurality of nanosheets NW1, and between the gate insulating layer 112 and the first layer 121. Further, the inner spacer 260 may be disposed between the active pattern 101 and the lowest nanosheet among the second plurality of nanosheets NW2, and between the gate insulating layer 112 and the first layer 121. The inner spacer 260 may be disposed between adjacent ones of the second plurality of nanosheets NW2, and between the gate insulating layer 112 and the first layer 121.

The inner spacer 260 may overlap each of the first and second pluralities of nanosheets NW1 and NW2 along the vertical direction DR3. The inner spacer 260 may contact each of the gate insulating layer 112 and the first layer 121. The inner spacer 260 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or combinations thereof. However, the present disclosure is not limited thereto.

Hereinafter, a semiconductor device according to some still further embodiments will be described with reference to FIG. 21. Following description will be based on differences thereof from the semiconductor device as shown in FIG. 1 to FIG. 3.

Figure 21:
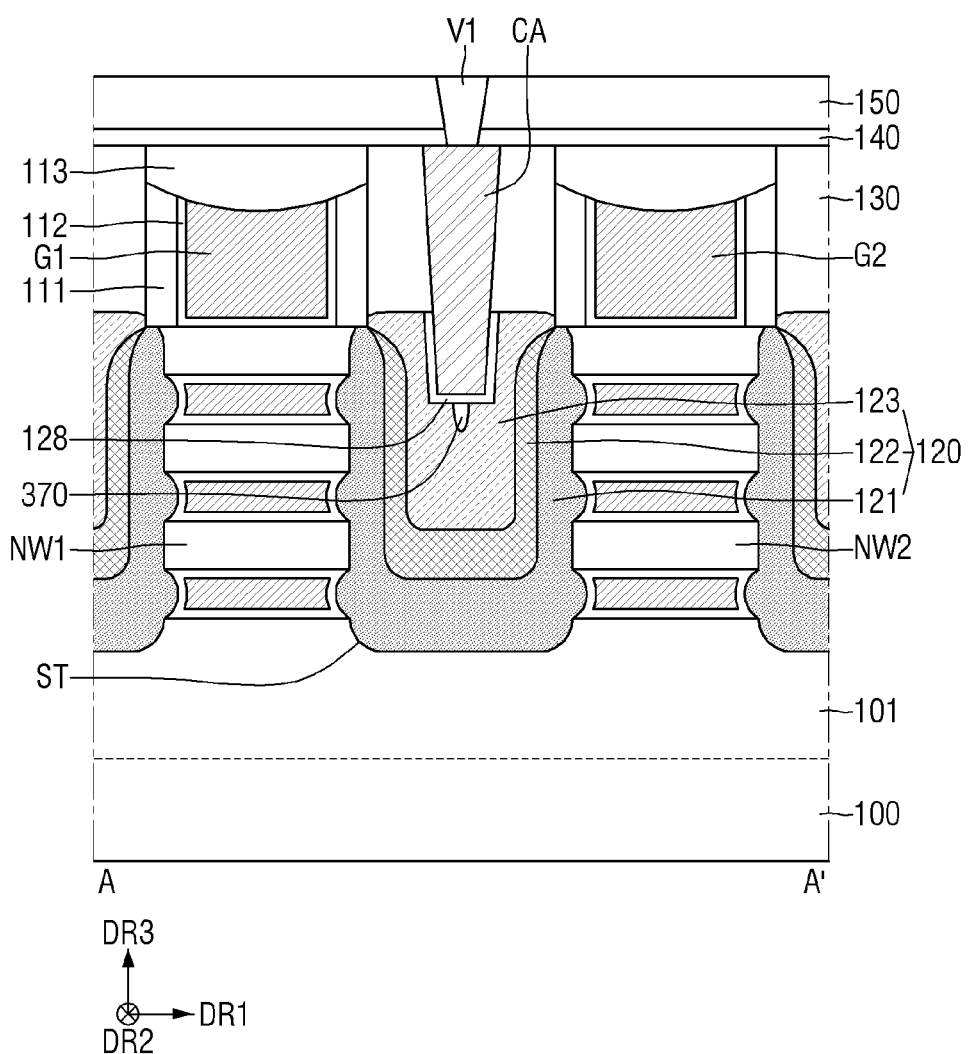
FIG. 21 is a cross-sectional view illustrating a semiconductor device according to some still further embodiments.

FIG. 21 is a cross-sectional view illustrating a semiconductor device according to some still further embodiments.

Referring to FIG. 21, an air gap 370 may be defined in the source/drain region 120 in the semiconductor device according to some still further embodiments. For example, the air gap 370 may be formed in the third layer 123. For example, the air gap 370 may be formed under the source/drain contact CA. That is, the air gap 370 may overlap the source/drain contact CA in the vertical direction DR3.

Hereinafter, a semiconductor device according to some still yet further embodiments will be described with reference to FIG. 22. Following description will be based on differences thereof from the semiconductor device as shown in FIG. 1 to FIG. 3.

Figure 22:
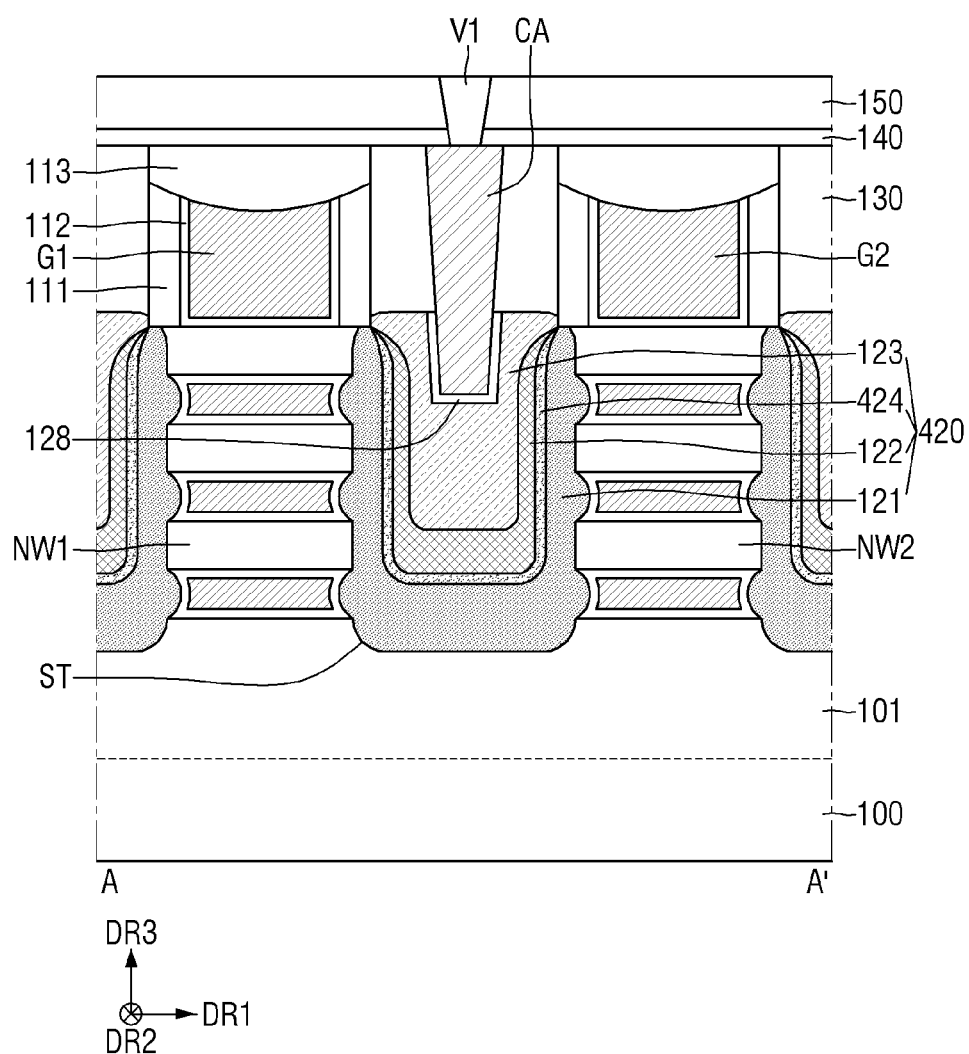
FIG. 22 is a cross-sectional view illustrating a semiconductor device according to some still yet further embodiments.

FIG. 22 is a cross-sectional view illustrating a semiconductor device according to some still yet further embodiments.

Referring to FIG. 22, a semiconductor device according to some still yet further embodiments includes a source/drain region 420 including the first layer 121, a fourth layer 424, the second layer 122, and the third layer 123 sequentially stacked.

For example, the fourth layer 424 may be disposed between the first layer 121 and the second layer 122. The fourth layer 424 may be disposed along and in an interface between the first layer 121 and the second layer 122. The fourth layer 424 may contact each of the first layer 121 and the second layer 122. For example, the fourth layer 424 may continuously extend. For example, the fourth layer 424 may be spaced apart from the sidewall of each of the first and second pluralities of nanosheets NW1 and NW2 in the first horizontal direction DR1. For example, the fourth layer 424 may extend to the upper surface of the uppermost nanosheet of each of the first and second pluralities of nanosheets NW1 and NW2. However, the present disclosure is not limited thereto.

For example, the fourth layer 424 may be formed by diffusing a portion of germanium (Ge) doped into the second layer 122 into the first layer 121 while the second layer 122 is being formed on the first layer 121. The fourth layer 424 may include silicon (Si). For example, the fourth layer 424 may be doped with both the first n-type impurity doped into the first layer 121 and the germanium (Ge) doped into the second layer 122. That is, the fourth layer 424 may include the doped first n-type impurity and the germanium (Ge).

Hereinafter, a semiconductor device according to some still yet further embodiments will be described with reference to FIG. 23. Following description will be based on differences thereof from the semiconductor device as shown in FIG. 1 to FIG. 3.

Figure 23:
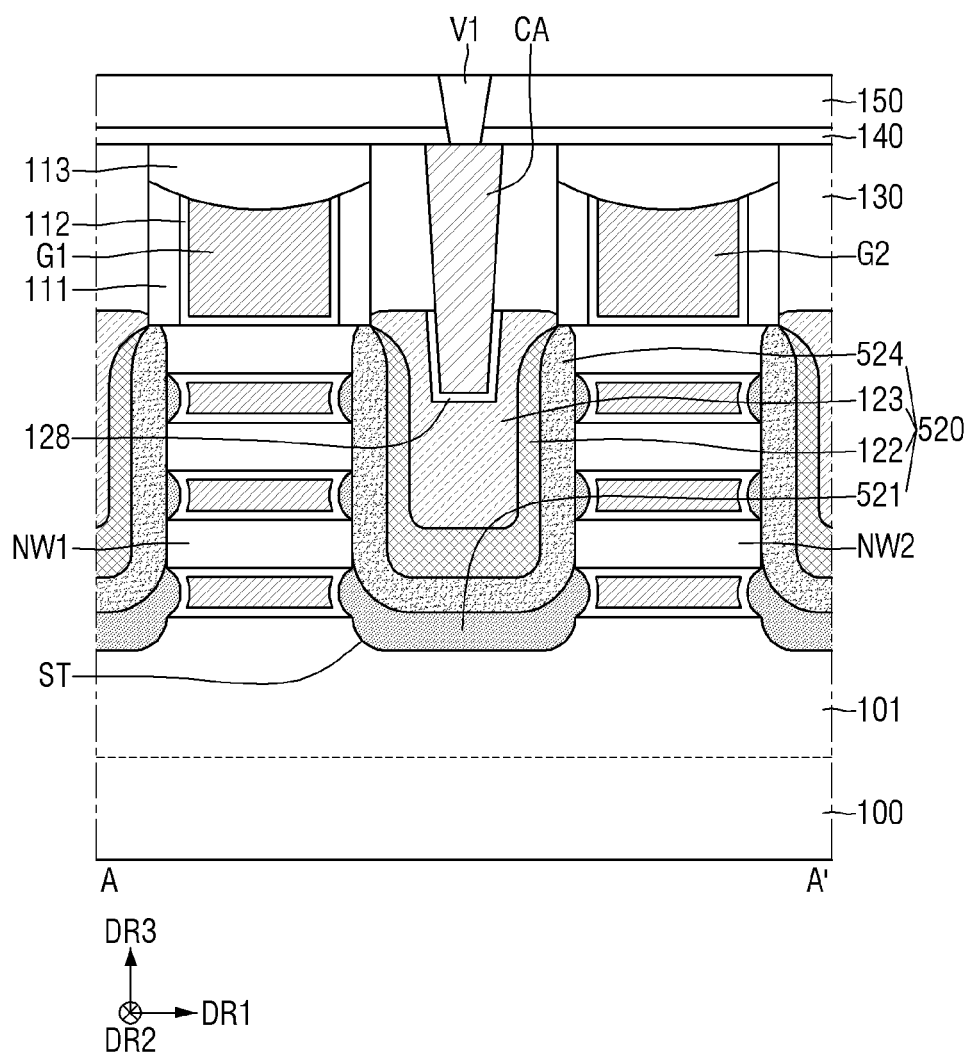
FIG. 23 is a cross-sectional view illustrating a semiconductor device according to some still yet further embodiments.

FIG. 23 is a cross-sectional view illustrating a semiconductor device according to some still yet further embodiments.

Referring to FIG. 23, a semiconductor device according to some still yet further embodiments includes a source/drain region 520 including a first layer 521, a fourth layer 524, the second layer 122, and the third layer 123 sequentially stacked.

For example, the fourth layer 524 may be disposed between the first layer 521 and the second layer 122. The fourth layer 524 may contact each of the first layer 521 and the second layer 122. Further, the fourth layer 524 may be disposed between each of the first and second pluralities of nanosheets NW1 and NW2 and the second layer 122. The fourth layer 524 may contact each of the first and second pluralities of nanosheets NW1 and NW2.

For example, at least a portion of the first layer 521 may be disposed between the first gate electrode G1 and the fourth layer 524, and between adjacent ones of the first plurality of nanosheets NW1. Further, at least a portion of the first layer 521 disposed between adjacent ones of the second plurality of nanosheets NW2 may be disposed between the second gate electrode G2 and the fourth layer 524. For example, the fourth layer 424 may continuously extend. For example, the fourth layer 524 may extend to the upper surface of the uppermost nanosheet of each of the first and second pluralities of nanosheets NW1 and NW2. However, the present disclosure is not limited thereto.

For example, the fourth layer 524 may be formed by diffusing a portion of germanium (Ge) doped into the second layer 122 into the first layer 521 while the second layer 122 is being formed on the first layer 521. The fourth layer 524 may include silicon (Si). For example, the fourth layer 524 may be doped with both the first n-type impurity doped into the first layer 521 and the germanium (Ge) doped into the second layer 122. That is, the fourth layer 524 may include the doped first n-type impurity and the germanium (Ge).

Hereinafter, a semiconductor device according to some still yet further embodiments will be described with reference to FIG. 24. Following description will be based on differences thereof from the semiconductor device as shown in FIG. 1 to FIG. 3.

Figure 24:
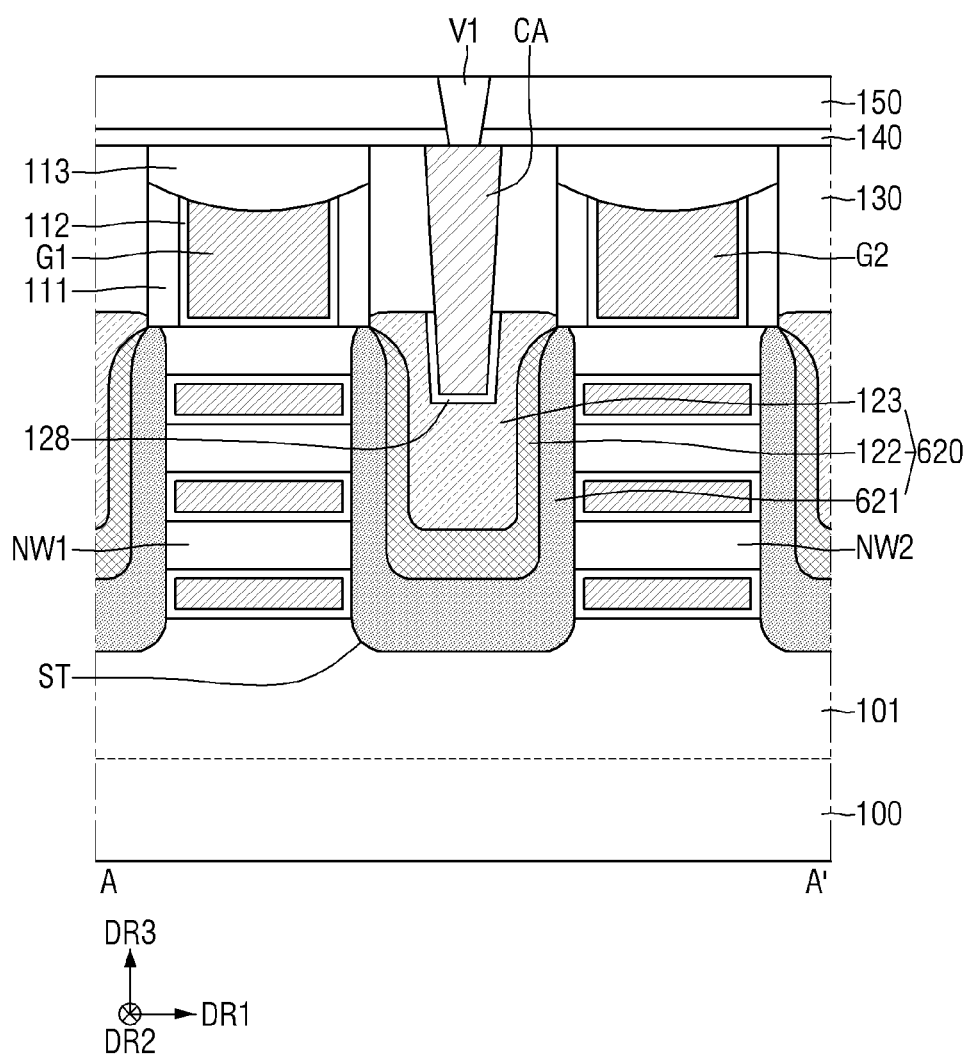
FIG. 24 is a cross-sectional view illustrating a semiconductor device according to some still yet further embodiments.

FIG. 24 is a cross-sectional view illustrating a semiconductor device according to some still yet further embodiments.

Referring to FIG. 24, in the semiconductor device according to some still yet further embodiments, each of opposite sidewalls in the first horizontal direction DR1 of a source/drain region 620 may have a continuous inclined profile.

For example, a sidewall of the first layer 621 in contact with a portion of the gate insulating layer 112 disposed on each of opposite sidewalls in the first horizontal direction DR1 of the first gate electrode G1 and between adjacent ones of the first plurality of nanosheet NW1 and in contact with a sidewall of each of the first plurality of nanosheets NW1 may have a continuous inclined profile. Further, a sidewall of the first layer 621 in contact with a portion of the gate insulating layer 112 disposed on each of opposite sidewalls in the first horizontal direction DR1 of the second gate electrode G2 and between adjacent ones of the second plurality of nanosheet NW2 and in contact with a sidewall of each of the second plurality of nanosheets NW2 may have a continuous inclined profile.

While aspects of embodiments have been particularly shown and described, it will be understood that various changes in form and details may be made therein without departing from the spirit and scope of the following claims.

What is claimed is:

1. A semiconductor device comprising:
   a substrate comprising an n-type metal-oxide-semiconductor field-effect transistor (NMOS) region;
   an active pattern extending in a first horizontal direction on the substrate;
   a plurality of nanosheets stacked on the active pattern and spaced apart from each other in a vertical direction;
   a gate electrode on the active pattern and surrounding the plurality of nanosheets, wherein the gate electrode extends in a second horizontal direction different from the first horizontal direction;
   a source/drain trench on the active pattern adjacent the gate electrode; and
   a source/drain region in the source/drain trench,
   wherein the source/drain region comprises:
      a first layer provided along a sidewall and a bottom surface of the source/drain trench, the first layer having a first n-type impurity doped therein;
      a second layer on the first layer in the source/drain trench, the second layer having germanium (Ge) doped therein; and a third layer filling a remaining portion of the source/drain trench on the second layer, the third layer having a second n-type impurity doped therein.

2. The semiconductor device of claim 1, wherein the first layer continuously extends along the sidewall and the bottom surface of the source/drain trench.

3. The semiconductor device of claim 1, wherein each of the first layer, the second layer and the third layer overlaps an uppermost nanosheet of the plurality of nanosheets in the first horizontal direction.

4. The semiconductor device of claim 1, wherein the first layer is in contact with a sidewall of each of the plurality of nanosheets.

5. The semiconductor device of claim 1, wherein each of the first n-type impurity and the second n-type impurity is different from germanium (Ge).

6. The semiconductor device of claim 5, wherein the first n-type impurity comprises one of phosphorus (P), arsenic (As), antimony (Sb), or bismuth (Bi), and the second n-type impurity comprises phosphorus (P).

7. The semiconductor device of claim 1, further comprising a gate insulating layer between the gate electrode and the first layer between adjacent ones of the plurality of nanosheets, the gate insulating layer being in contact with the first layer.

8. The semiconductor device of claim 1, further comprising an inner spacer between the gate electrode and the first layer between adjacent ones of the plurality of nanosheets, the inner spacer being in contact with the first layer.

9. The semiconductor device of claim 1, wherein the second layer is in contact with the first layer.

10. The semiconductor device of claim 1, wherein the source/drain region further comprises a fourth layer between the first layer and the second layer, and
wherein the fourth layer is doped with both the first n-type impurity and germanium (Ge).

11. The semiconductor device of claim 10, wherein the fourth layer is in contact with a sidewall of each of the plurality of nanosheets.

12. The semiconductor device of claim 11, wherein at least a portion of the first layer is between the gate electrode and the fourth layer between adjacent ones of the plurality of nanosheets.

13. A semiconductor device comprising:
a substrate comprising an n-type metal-oxide-semiconductor field-effect transistor (NMOS) region;
an active pattern extending in a first horizontal direction on the substrate;
a plurality of nanosheets stacked on the active pattern and spaced apart from each other in a vertical direction;
a gate electrode on the active pattern and surrounding the plurality of nanosheets, wherein the gate electrode extends in a second horizontal direction different from the first horizontal direction;
a source/drain trench on the active pattern adjacent the gate electrode;
a source/drain region in the source/drain trench; and
a gate insulating layer between the gate electrode and the source/drain region between adjacent ones of the plurality of nanosheets, the gate insulating layer being in contact with the source/drain region,
wherein the source/drain region comprises:
a first layer continuously extending along a sidewall and a bottom surface of the source/drain trench, the first layer having a first n-type impurity doped therein; and
a second layer on the first layer in the source/drain trench, the second layer having germanium (Ge) doped therein.

14. The semiconductor device of claim 13, wherein the source/drain region further comprises a third layer on the second layer that fills a remaining portion of the source/drain trench, wherein the third layer has a second n-type impurity doped therein, and
wherein each of the first n-type impurity and the second n-type impurity is different from germanium (Ge).

15. The semiconductor device of claim 14, further comprising an air gap in the third layer.

16. The semiconductor device of claim 13, wherein each of the first layer and the second layer overlaps an uppermost nanosheet of the plurality of nanosheets in the first horizontal direction.

17. The semiconductor device of claim 13, wherein the source/drain region further comprises a fourth layer between the first layer and the second layer, and
wherein the fourth layer is doped with both the first n-type impurity and germanium (Ge).

18. The semiconductor device of claim 13, wherein a content of germanium (Ge) doped into the second layer is in a range of 3 at % (atomic percent) to 20 at %.

19. The semiconductor device of claim 13, wherein a thickness of the second layer is in a range of 1 nm to 5 nm.

20. A semiconductor device comprising:
a substrate comprising an n-type metal-oxide-semiconductor field-effect transistor (NMOS) region;
an active pattern extending in a first horizontal direction on the substrate;
a plurality of nanosheets stacked on the active pattern and spaced apart from each other in a vertical direction;
a gate electrode on the active pattern and surrounding the plurality of nanosheets, wherein the gate electrode extends in a second horizontal direction different from the first horizontal direction;
a source/drain trench on the active pattern adjacent the gate electrode;
a source/drain region in the source/drain trench; and
a gate insulating layer between the gate electrode and the source/drain region between adjacent ones of the plurality of nanosheets, the gate insulating layer being in contact with the source/drain region,
wherein the source/drain region comprises:
a first layer continuously extending along a sidewall and a bottom surface of the source/drain trench, the first layer being in contact with a sidewall of each of the plurality of nanosheets, and the first layer having a first n-type impurity doped therein;
a second layer on the first layer in the source/drain trench, the second layer being in contact with the first layer, and the second layer having germanium (Ge) doped therein; and
a third layer filling a remaining portion of the source/drain trench on the second layer, the third layer having a second n-type impurity doped therein,
wherein each of the first n-type impurity and the second n-type impurity is different from germanium (Ge), and
wherein each of the first layer, the second layer and the third layer overlaps an uppermost nanosheet of the plurality of nanosheets in the first horizontal direction.

* * * * *